United States Patent
Yamashita et al.

(10) Patent No.: US 8,676,061 B2
(45) Date of Patent: Mar. 18, 2014

(54) SIGNAL OUTPUT DEVICE, AND OUTPUT APPARATUS OF SIGNAL SOURCE OF SIGNALS AND OF LASER BEAM PULSES

(75) Inventors: Tomoyu Yamashita, Miyagi (JP); Akiyoshi Irisawa, Miyagi (JP)

(73) Assignee: Advantest Corporation, Tokyo (JP)

( * ) Notice: Subject to any disclaimer, the term of this patent is extended or adjusted under 35 U.S.C. 154(b) by 609 days.

(21) Appl. No.: 12/940,131

(22) Filed: Nov. 5, 2010

(65) Prior Publication Data

US 2011/0170875 A1    Jul. 14, 2011

(30) Foreign Application Priority Data

Nov. 19, 2009   (JP) .................................. 2009-264039

(51) Int. Cl.
  *H04B 10/04*   (2011.01)
  *H04B 10/12*   (2011.01)

(52) U.S. Cl.
  USPC ............................ 398/189; 398/182; 398/183

(58) Field of Classification Search
  USPC ................................................. 398/182–201
  See application file for complete search history.

(56) References Cited

U.S. PATENT DOCUMENTS

| | | | |
|---|---|---|---|
| 5,585,913 | A | 12/1996 | Hariharan et al. |
| 5,598,440 | A * | 1/1997 | Domagala ..................... 375/329 |
| 5,778,016 | A | 7/1998 | Sucha et al. |
| 6,396,856 | B1 | 5/2002 | Sucha et al. |
| 6,867,693 | B1 * | 3/2005 | Radin ....................... 340/539.13 |
| 2002/0097761 | A1 | 7/2002 | Sucha et al. |
| 2005/0003785 | A1 * | 1/2005 | Jackson et al. ............... 455/260 |
| 2007/0242276 | A1 | 10/2007 | Hughes et al. |
| 2008/0165355 | A1 | 7/2008 | Yasui et al. |
| 2009/0296749 | A1 | 12/2009 | Sucha et al. |
| 2011/0227784 | A1 * | 9/2011 | Beasley et al. ................ 342/195 |

FOREIGN PATENT DOCUMENTS

| | | |
|---|---|---|
| JP | 10-96610 | 4/1998 |
| JP | 11-150421 | 6/1999 |
| JP | 2007-286062 | 11/2007 |
| WO | 2006/092874 | 9/2006 |

OTHER PUBLICATIONS

A. Bartels et al., "Ultrafast time-domain spectroscopy based on high-speed asynchronous optical sampling", Review of Scientific Instruments, vol. 78 (2007), pp. 035107-1-035107-8.

Takeshi Yasui et al., "Asynchronous optical sampling terahertz time-domain spectroscopy for ultrahigh spectral resolution and rapid data acquisition", Applied Physics Letters, vol. 87 (Aug. 1, 2005), pp. 061101-1-061101-3.

A. Bartels et al., "High-resolution THz spectrometer with kHz scan rates", Optics Express, vol. 14, No. I (2006), pp. 430-437.

(Continued)

*Primary Examiner* — Daniel Dobson
(74) *Attorney, Agent, or Firm* — Greenblum & Bernstein, P.L.C.

(57) ABSTRACT

A frequency converter includes a first direct digital synthesizer that receives a signal having a predetermined frequency f_master as a clock signal and further an internal frequency setting signal, and outputs an internal signal having a frequency based on the internal frequency setting signal, and a second direct digital synthesizer that receives the internal signal as a clock signal, and further an output frequency setting signal, and outputs an output signal having a frequency f_slave (=f_master−Δ) based on the output frequency setting signal. A difference between the predetermined frequency f_master and the frequency of the internal signal is larger than a difference between the predetermined frequency f_master and the frequency f_slave of the output signal.

16 Claims, 15 Drawing Sheets

(56) References Cited

OTHER PUBLICATIONS

A. Bartels et al., "Femtosecond time-resolved optical pump-probe spectroscopy at kilohertz-scan-rates over nanosecond-time-delays without mechanical delay line", Applied Physics Letters, vol. 88 No. 4 (2006), pp. 041117-041119.

C. Janke et al., "Asynchronous optical sampling for high-speed characterization of integrated resonant terahertz sensors", Optics Letters, vol. 30 No. 11 (2005), pp. 1405-1407.

Y. Takagi et al., "Subpicosecond optical sampling spectrometer using asynchronous tunable mode-locked lasers", Review of Scientific Instruments, vol. 70, No. 5, (May 1999), pp. 2218-2224.

* cited by examiner

US 8,676,061 B2

SIGNAL OUTPUT DEVICE, AND OUTPUT APPARATUS OF SIGNAL SOURCE OF SIGNALS AND OF LASER BEAM PULSES

BACKGROUND ART

1. Technical Field of the Invention

The present invention relates to an output of signals synchronized in terms of frequency.

2. Related Art

Making repetition frequencies of optical pulses output from two lasers coincident with each other has conventionally been known (refer to FIG. 13 of a patent document 1).

As relevant documents, patent document 2, and non-patent documents 1-6 can be listed.

(Patent Document 1) Japanese Laid-Open Patent Publication (Kokai) No. H10-96610
(Patent Document 2) PCT Pamphlet W02006/92874
(Non-Patent Document 1) Bartels et al, "Ultrafast time-domain spectroscopy based on high-speed asynchronous optical sampling", Rev. Sci. Instrum., vol.78, pp.035107 (2007)
(Non-Patent Document 2) T. Yasui et al, "Asynchronous optical sampling terahertz time-domain spectroscopy for ultrahigh spectral resolution and rapid data acquisition", Appl. Phys. Lett., vol.87, pp.061101 (2005)
(Non-Patent Document 3) A. Bartels et al, "High-resolution THz spectrometer with kHz scan rates", Optics express, vol.14, pp.430 (2006)
(Non-Patent Document 4) A. Bartels et al, "Femtosecond time-resolved optical pump-probe spectroscopy at kilohertz-scan-rates iver nanosecond-time-delays without mechanical delay line", Appl. Phys. Lett., vol.88, pp.041117 (2006)
(Non-Patent Document 5) C. Janke et al, "Asynchronous optical sampling for high-speed characterization of integrated resonant terahertz sensors", Optics Letters, vol.30, pp.1405 (2005)
(Non-Patent Document 6) Y. Takagi et al, "Subpicosecond optical sampling spectrometer using asynchronous tunable mode-locked lasers", Rev. Sci. Instrum., vol.70, pp.2218 (1999)

SUMMARY OF THE INVENTION

It is therefore an object of the present invention to restrain a jitter of optical pulses output from two lasers even if repetition frequencies of the optical pulses are differentiated by a predetermined frequency.

According to the present invention, a signal output device includes: a first direct digital synthesizer that receives a signal having a predetermined frequency as a clock signal and further an internal frequency setting signal, and outputs an internal signal having a frequency based on the internal frequency setting signal; and a second direct digital synthesizer that receives the internal signal as a clock signal, and further an output frequency setting signal, and outputs an output signal having a frequency based on the output frequency setting signal, wherein a difference between the predetermined frequency and the frequency of the internal signal is larger than a difference between the predetermined frequency and the frequency of the output signal.

According to the thus constructed signal output device, a first direct digital synthesizer receives a signal having a predetermined frequency as a clock signal and further an internal frequency setting signal, and outputs an internal signal having a frequency based on the internal frequency setting signal. A second direct digital synthesizer receives the internal signal as a clock signal, and further an output frequency setting signal, and outputs an output signal having a frequency based on the output frequency setting signal. A difference between the predetermined frequency and the frequency of the internal signal is larger than a difference between the predetermined frequency and the frequency of the output signal.

According to the signal output device of the present invention, the difference between the predetermined frequency and the frequency of the internal signal may be larger than 10 kHz.

According to the signal output device of the present invention, if the difference between the predetermined frequency and the frequency of the internal signal is represented as P[MHz], and the predetermined frequency is represented as Q[MHz], P and Q may be coprime, and P may not be 1.

According to the signal output device of the present invention, the first direct digital synthesizer may set a phase based on the internal frequency setting signal upon reception of the signal having the predetermined frequency; and output a signal having an amplitude corresponding to an amplitude of a sine wave at the phase.

According to the signal output device of the present invention, the second direct digital synthesizer may set a phase based on the output frequency setting signal upon reception of the internal signal; and output a signal having an amplitude corresponding to an amplitude of a sine wave at the phase.

According to the signal output device of the present invention, the signal having the predetermined frequency may be a signal output from an oven-controlled crystal oscillator.

According to the present invention, a first signal source of a plurality of signals includes: the signal output device according to the present invention; a first crystal oscillator that outputs a signal having the predetermined frequency; a second crystal oscillator; a phase difference detector that detects a phase difference between an output from the signal output device and an output from the second crystal oscillator; and a loop filter that removes a high frequency component of an output from the phase difference detector, wherein: the second crystal oscillator changes an oscillation frequency according to an output from the loop filter; the output from the first crystal oscillator is a first output; and the output from the second crystal oscillator is a second output.

According to the first signal source of a plurality of signals of the present invention, at least one of the first crystal oscillator and the second crystal oscillator may be an oven-controlled crystal oscillator.

According to the present invention, a second signal source of a plurality of signals includes: two of the signal output devices according to the present invention; a first crystal oscillator that outputs a signal having the predetermined frequency; a second crystal oscillator; a third crystal oscillator; a first phase difference detector that detects a phase difference between an output from one of the signal output devices and an output from the second crystal oscillator; a first loop filter that removes a high frequency component of an output from the first phase difference detector; a second phase difference detector that detects a phase difference between an output from the other of the signal output device and an output from the third crystal oscillator; and a second loop filter that removes a high frequency component of an output from the second phase difference detector, wherein: the second crystal oscillator changes an oscillation frequency according to an output from the first loop filter; the third crystal oscillator changes an oscillation frequency according to an output from the second loop filter; the output from the first crystal oscillator is a first output; the output from the second crystal oscillator is a second output; and the output from the third crystal oscillator is a third output.

According to the second signal source of a plurality of signals of the present invention, at least one of the first crystal oscillator, the second crystal oscillator, and the third crystal oscillator may be an oven-controlled crystal oscillator.

According to the present invention, a first output device of a plurality of laser light pulses includes: the first signal source of a plurality of signals according to the present invention; a first laser that outputs a first laser light pulse; a phase difference detector for first laser that detects a phase difference between an electric signal obtained by converting the first laser light pulse and the first output; a loop filter for first laser that removes a high frequency component of an output from the phase difference detector for first laser; a second laser that outputs a second laser light pulse; a phase difference detector for second laser that detects a phase difference between an electric signal obtained by converting the second laser light pulse and the second output; and a loop filter for second laser that removes a high frequency component of an output from the phase difference detector for the second laser, wherein: the first laser changes a repetition frequency of the first laser light pulse according to an output from the loop filter for first laser; and the second laser changes a repetition frequency of the second laser light pulse according to an output from the loop filter for second laser.

The first output device of a plurality of laser light pulses according to the present invention may include a phase shifter that receives any one of the output from the first laser before the conversion into the electric signal, the electric signal obtained by converting the output from the first laser, and the first output, changes the phase thereof, and outputs a result of the change in phase, wherein the frequency of the first output and the frequency of the second output are equal to each other.

The first output device of a plurality of laser light pulses according to the present invention may include a phase shifter that receives any one of the output from the second laser before the conversion into the electric signal, the electric signal obtained by converting the output from the second laser, and the second output, changes the phase thereof, and outputs a result of the change in phase, wherein the frequency of the first output and the frequency of the second output are equal to each other.

The first output device of a plurality of laser light pulses according to the present invention may include an analog signal adder that adds an analog signal to either one of the output from the loop filter for first laser and the output from the loop filter for second laser.

According to the first output device of a plurality of laser light pulses of the present invention, the analog signal may be any one of a square wave, a sinusoidal wave, a rectangular wave, and a signal having a waveform arbitrarily specified by a user of the output device of a plurality of laser light pulses.

According to the present invention, a second output device of a plurality of laser light pulses includes: the second signal source of a plurality of signals according to the present invention; a first laser that outputs a first laser light pulse; a phase difference detector for first laser that detects a phase difference between an electric signal obtained by converting the first laser light pulse and the first output; a loop filter for first laser that removes a high frequency component of an output from the phase difference detector for the first laser; a switch that receives the second output and the third output and outputs either one of the second output and the third output; a second laser that outputs a second laser light pulse; a phase difference detector for second laser that detects a phase difference between an electric signal obtained by converting the second laser light pulse and the output from the switch; and a loop filter for second laser that removes a high frequency component of an output from the phase difference detector for the second laser, wherein: the first laser changes a repetition frequency of the first laser light pulse according to an output from the loop filter for first laser; and the second laser changes a repetition frequency of the second laser light pulse according to an output from the loop filter for second laser.

PREFERRED EMBODIMENTS

A description will now be given of embodiments of the present invention referring to drawings.

First Embodiment

Figure 1:
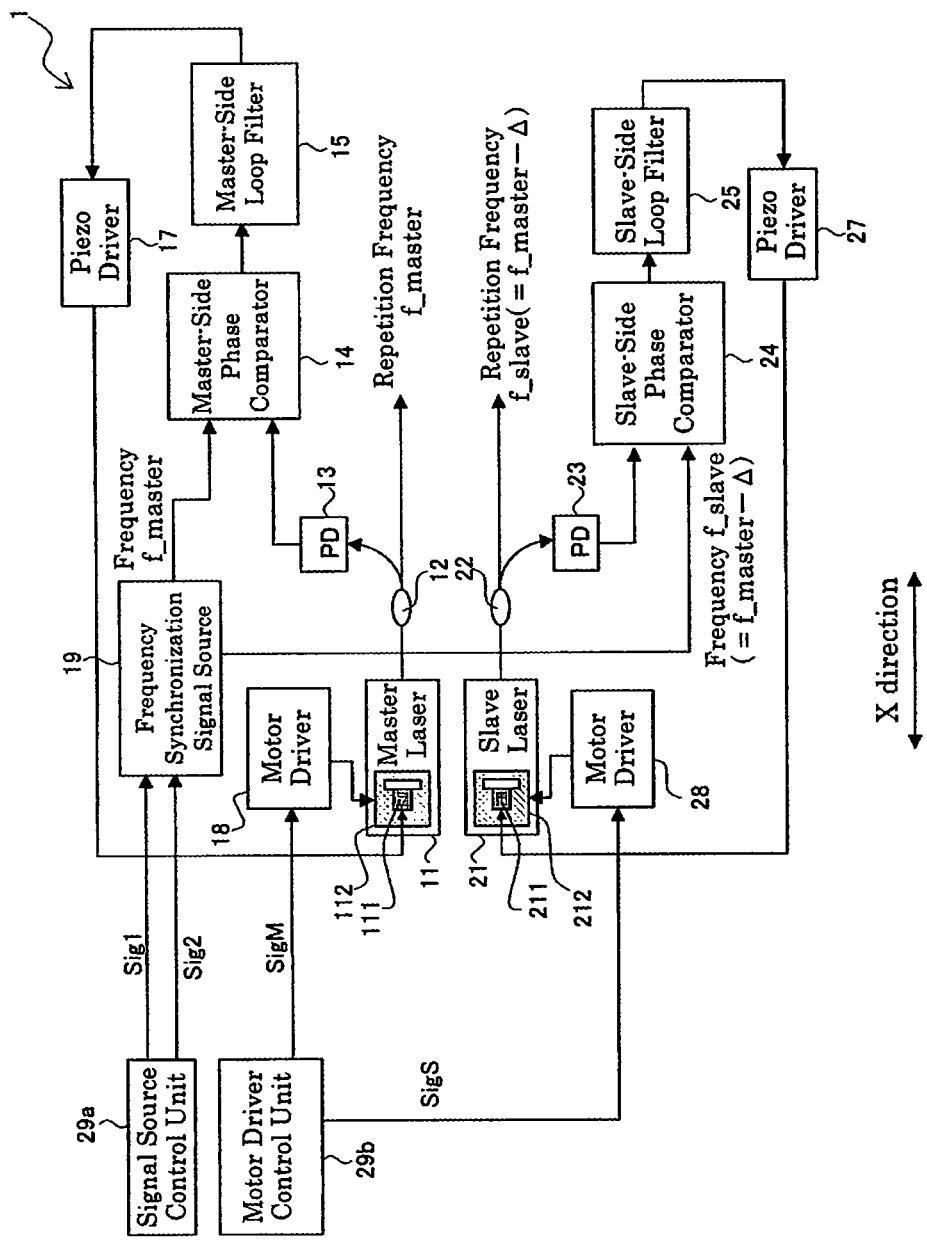
FIG. 1 is a diagram showing a configuration of an output device of multiple laser light pulses 1 according to a first embodiment of the present invention.

FIG. 1 is a diagram showing a configuration of an output device of multiple laser light pulses 1 according to a first embodiment of the present invention. The output device of multiple laser light pulses 1 outputs a first laser light pulse having a repetition frequency f_master and a second laser light pulse having a repetition frequency f_slave (=f_master−Δ). For example, f_master is 50 MHz. Δ is a minute value compared with f_master, and is 5 Hz or 10 Hz. It should be noted that Δ is not limited to 5 Hz or 10 Hz, and may be a value increased from −300 Hz to +300 Hz by an increment of 0.001 Hz (−300 Hz, −300 Hz+0.001 Hz, −300 Hz+0.002 Hz, . . . , +300 Hz−0.001 Hz, +300 Hz).

The output device of multiple laser light pulses 1 according to the first embodiment includes a master laser (first laser) 11, an optical coupler 12, a photodiode 13, a master-side phase comparator (phase difference detector for first laser) 14, a master-side loop filter (loop filter for first laser) 15, a piezo driver 17, a motor driver 18, a frequency synchronization signal source (signal source of multiple signals) 19, a slave laser (second laser) 21, an optical coupler 22, a photodiode 23, a slave-side phase comparator (phase difference detector for second laser) 24, a slave-side loop filter (loop filter for second laser) 25, a piezo driver 27, a motor driver 28, a signal source control unit 29a, and a motor driver control unit 29b.

The frequency synchronization signal source (signal source of multiple signals) 19 outputs a signal having the frequency f_master (first output) and a signal having the frequency f_slave (=f_master−Δ) (second output).

The master laser (first laser) 11 outputs a first laser light pulse having the repetition frequency f_master.

The master laser (first laser) 11 includes a piezo element 111 and a translation stage 112. The piezo element 111 contracts and extends in an X direction (widthwise direction in FIG. 1) as a result of impression of a voltage. The translation stage 112 translates in the X direction. The laser resonator length of the master laser 11 is controlled by the contraction/extension in the X direction of the piezo element 111, and the translation in the X direction of the translation stage 112, and the repetition frequency of the first laser light pulse output from the master laser 11 is thus controlled.

The optical coupler 12 receives the first laser light pulse output from the master laser 11, and outputs the laser light pulse to a photodiode 13 and the outside at a ratio of 1:9 as a power ratio, for example. For example, the optical power of the first laser light pulse fed to the photodiode 13 is 10% of the optical power of the first laser light pulse output from the master laser 11.

The photodiode 13 receives the first laser light pulse from the optical coupler 12, and converts the first laser light pulse into an electric signal.

The master-side phase comparator (phase difference detector for first laser) 14 compares, in phase, the output from the photodiode 13 and the signal having the frequency f_master (first output) output from the frequency synchronization signal source (signal source of multiple signals) 19 with each other, and detects and outputs a phase difference therebetween.

The master-side loop filter (loop filter for first laser) 15 removes a high-frequency component of the output from the master-side phase comparator 14. It should be noted that "removal" does not necessarily imply a complete removal, and includes a case in which a slight amount of the high-frequency component is left. "Removal" in a subsequent section has the same connotation.

An output from the master-side loop filter 15 results in a DC voltage signal. Moreover, control for the repetition frequency of the master laser 11 is stabilized by properly setting the time constant of the master-side loop filter 15.

The piezo driver 17 is a power amplifier, for example, and amplifies the output from the master-side loop filter 15. The piezo driver 17 amplifies the output from the master-side loop filter 15 to 0-+150 V, for example. An output from the piezo driver 17 is fed to the piezo element 111. As a result, the piezo element 111 contracts/extends in the X direction. It should be noted that the piezo element 111 is caused to contract/extend so that the phase difference detected by the master-side phase comparator 14 has a constant value (0 degree, 90 degrees, or −90 degrees, for example). As a result, it is possible to precisely make the repetition frequency of the first laser light pulse coincident with the frequency f_master of the first output from the frequency synchronization signal source 19.

In other words, the first laser 11 changes the repetition frequency of the first laser light pulse to f_master by contracting/extending the piezo element 111 in the X direction according to the output from the master-side loop filter 15.

The motor driver 18 is a circuit for driving a motor (not shown) for driving the translation stage 112. The motor driver 18 translates the translation stage 112 in the X direction, thereby roughly making the repetition frequency of the first laser light pulse coincident with the frequency f_master.

The slave laser (second laser) 21 outputs a second laser light pulse having the repetition frequency f_slave (=f_master−Δ).

The slave laser (second laser) 21 includes a piezo element 211 and a translation stage 212. The piezo element 211 contracts and extends in the X direction (widthwise direction in FIG. 1) as a result of impression of a voltage. The translation stage 212 translates in the X direction. The laser resonator length of the slave laser 21 is controlled by the contraction/extension in the X direction of the piezo element 211, and the translation in the X direction of the translation stage 212, and the repetition frequency of the second laser light pulse output from the slave laser 21 is thus controlled.

The optical coupler 22 receives the second laser light pulse output from the slave laser 21, and outputs the laser light pulse to a photodiode 23 and the outside at a ratio of 1:9 as a power ratio, for example. For example, the optical power of the second laser light pulse fed to the photodiode 23 is 10% of the optical power of the second laser light pulse output from the slave laser 21.

The photodiode 23 receives the second laser light pulse from the optical coupler 22, and converts the second laser light pulse into an electric signal.

The slave-side phase comparator (phase difference detector for second laser) 24 compares, in phase, the output from the photodiode 23 and the signal having the frequency f_slave (second output) output from the frequency synchronization signal source (signal source of multiple signals) 19 with each other, and detects and outputs a phase difference therebetween.

The slave-side loop filter (loop filter for second laser) 25 removes a high frequency component of the output from the slave-side phase comparator 24.

The piezo driver 27 is a power amplifier, for example, and amplifies the output from the slave-side loop filter 25. The piezo driver 27 amplifies the output from the slave-side loop filter 25 to 0-+150V, for example. The output from the piezo driver 27 is fed to the piezo element 211. As a result, the piezo element 211 contracts/extends in the X direction. It should be noted that the piezo element 211 is caused to contract/extend so that the phase difference detected by the slave-side phase comparator 24 has a constant value (0 degree, 90 degrees, or −90 degrees, for example). As a result, it is possible to precisely make the repetition frequency of the second laser light pulse coincident with the frequency f_slave of the second output from the frequency synchronization signal source 19.

In other words, the second laser 21 changes the repetition frequency of the second laser light pulse to f_slave by contracting/extending the piezo element 211 in the X direction according to the output from the slave-side loop filter 25.

The motor driver 28 is a circuit for driving a motor (not shown) for driving the translation stage 212. The motor driver 28 translates the translation stage 212 in the X direction, thereby roughly making the repetition frequency of the second laser light pulse coincident with the frequency f_slave.

The signal source control unit 29a feeds an internal frequency setting signal Sig1 and an output frequency setting signal Sig2 to the frequency synchronization signal source 19, thereby controlling the frequency synchronization signal source 19.

The motor driver control unit 29b feeds a signal SigM to the motor driver 18, and feeds a signal SigS to the motor driver 28, thereby operating the motor drivers 18, 28 as described above.

Figure 2:
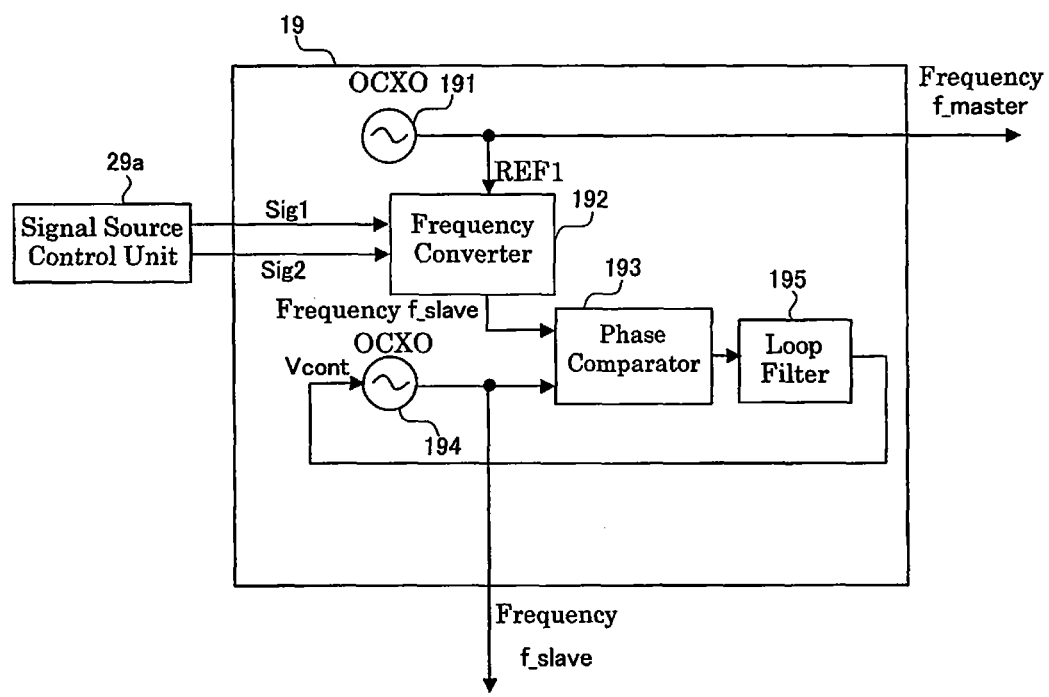
FIG. 2 is a diagram showing a configuration of the frequency synchronization signal source 19 according to the first embodiment.

FIG. 2 is a diagram showing a configuration of the frequency synchronization signal source 19 according to the first embodiment. The frequency synchronization signal source 19 according to the first embodiment includes a first crystal oscillator 191, a frequency converter (signal output device) 192, a phase comparator (phase difference detector) 193, a second crystal oscillator 194, and a loop filter 195.

The first crystal oscillator 191 outputs a signal having the predetermined frequency (f_master). One or both of the first crystal oscillator 191 and the second crystal oscillator 194 are preferably oven-controlled crystal oscillators (OCXO). If the first crystal oscillator 191 and the second crystal oscillator 194 are oven-controlled crystal oscillators, a variable frequency range (ratio to the output frequency) is $\pm 5 \times 10^{-6}$, for example. The oven-controlled crystal oscillator (OCXO) can provide a signal which has an extremely low phase noise, and an extremely high frequency stability The phase comparator (phase difference detector) 193 compares, in phase, an output from the frequency converter (signal output device) 192 and an output from the second crystal oscillator 194, and detects and outputs a difference therebetween.

The loop filter 195 removes a high-frequency component of the output from the phase comparator 193.

It should be noted that the second crystal oscillator 194 receives an output (Vcont) from the loop filter 195, and changes the oscillation frequency according to Vcont. The second crystal oscillator 194 changes the oscillation frequency so that the phase difference output from the phase comparator 193 has a constant value (0 degree, 90 degrees, or −90 degrees, for example).

On this occasion, the output from the first crystal oscillator 191 is designated as first output (signal having the frequency f_master). The output from the second crystal oscillator 194 is designated as second output (signal having the frequency f_slave).

Figure 3:
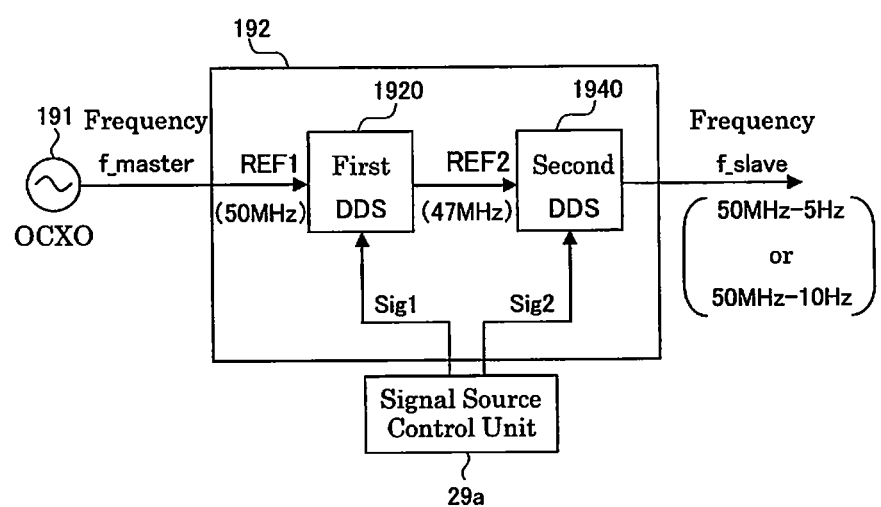
FIG. 3 is a diagram showing a configuration of the frequency converter (signal output device) 192 according to the first embodiment.

FIG. 3 is a diagram showing a configuration of the frequency converter (signal output device) 192 according to the first embodiment. The frequency converter (signal output device) 192 outputs the signal (frequency: f_slave) having a frequency stability similar to the frequency stability of the signal REF1 fed from the first crystal oscillator 191 (oven-controlled crystal oscillator, for example).

The frequency converter (signal output device) 192 includes a first DDS (first direct digital synthesizer) 1920 and a second DDS (second direct digital synthesizer) 1940. The first DDS 1920 and the second DDS 1940 can output an electric signal up to approximately 100 MHz at a resolution set to 0.001 Hz to 1 Hz.

The first DDS 1920 receives, as a clock signal, the signal REF1 having the predetermined frequency (f_master) output from the first crystal oscillator 191 (such as oven-controlled crystal oscillator). The first DDS 1920 further receives the internal frequency setting signal Sig1. The first DDS 1920 outputs an internal signal REF2 having a frequency based on the internal frequency setting signal Sig1. It should be noted that f_master is 50 MHz as described before, for example. The frequency of the internal signal REF2 is 47 MHz, for example. It is assumed that a difference between the predetermined frequency (f_master=50 MHz) and the frequency (47 MHz) of the internal signal is larger than 10 kHz.

The second DDS 1940 receives the internal signal REF2 as a clock signal. The second DDS 1940 further receives the output frequency setting signal Sig2. The second DDS 1940 outputs the output signal having the frequency f_slave based on an output frequency setting signal Sig2.

A difference between the predetermined frequency (f_master=50 MHz) and the frequency (47 MHz) of the internal signal is larger than the difference Δ (5 Hz or 10 Hz) between the predetermined frequency and the output signal.

Though the first DDS 1920 and the second DDS 1940 are well-known direct digital synthesizers (DDS), a brief description will now be given of a configuration thereof.

Figure 4:
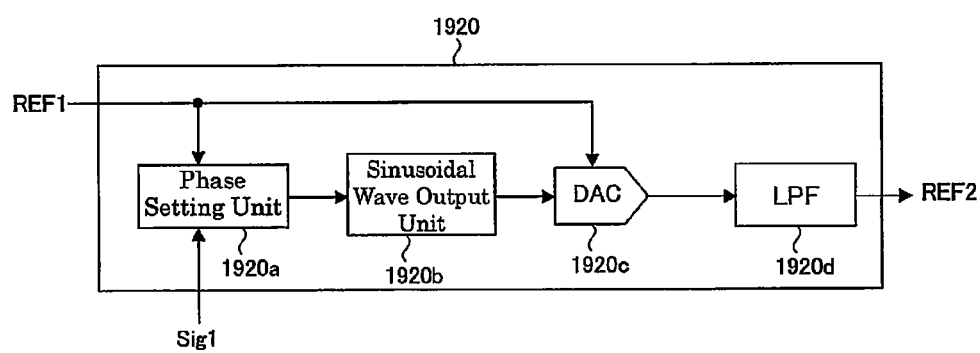
FIG. 4 is a diagram showing a configuration of the first DDS 1920 according to the first embodiment.

FIG. 4 is a diagram showing a configuration of the first DDS 1920 according to the first embodiment. The first DDS 1920 includes a phase setting unit 1920a, a sinusoidal wave output unit 1920b, a D/A converter (DAC) 1920c, and a low-pass filter (LPF) 1920d.

The sinusoidal wave output unit 1920b stores amplitudes of a sinusoidal wave for one period associated with phases represented in N bits (N is an integer equal to or more than 1). The phase takes a value from 0-360 degrees, and amplitudes of the sinusoidal wave at respective phases obtained by equally dividing 360 degrees by $2^N$ are stored. If a phase represented by N bits is input, the sinusoidal wave output unit 1920b outputs a signal having a magnitude corresponding to the amplitude of the sinusoidal wave at the phase.

The phase setting unit 1920a sets a phase based on the internal frequency setting signal Sig1 upon reception of the signal REF1 having the predetermined frequency (f_master), and feeds the phase to the sinusoidal wave output unit 1920b.

The D/A converter (DAC) 1920c converts the digital signal output from the sinusoidal wave output unit 1920b into an analog signal, and outputs the converted analog signal. The signal REF1 is also fed as a clock signal to the D/A converter 1920c.

The low-pass filter (LPF) 1920d removes a high-frequency component of the output from the D/A converter 1920c. An output from the low-pass filter 1920d results in the internal signal REF2 which is the output from the first DDS 1920.

The phase setting unit 1920a increments the phase by one bit (360 degrees is represented by N bits) each time when the phase setting unit 1920a receives the signal REF1 (frequency: f_master), and feeds the phase to the sinusoidal wave output unit 1920b. As a result, the frequency of the signal output from the sinusoidal wave output unit 1920b is represented as $(1/2^N) \times$ f_master.

Similarly, if the phase setting unit 1920a increments the phase by X bits each time when the phase setting unit 1920a receives the signal REF1 (frequency: f_master), and feeds the phase to the sinusoidal wave output unit 1920a, the frequency of the signal output from the sinusoidal wave output unit 1920b (=frequency of the internal signal REF2) is represented as $(X/2^N) \times$ f_master. The incrementing the phase set by the phase setting unit 1920a by X bits can be realized by a latch and an adder. The circuit configuration is the same as a well-known DDS, and hence a description thereof is omitted.

It is appreciated that the frequency of the internal signal REF2 can be changed according to the value of X. On this occasion, a value of X which causes the frequency of the internal signal REF2 to be a desired value (such as 47 MHz) is fed as the internal frequency setting signal Sig1 to the phase setting unit 1920a.

Figure 5:
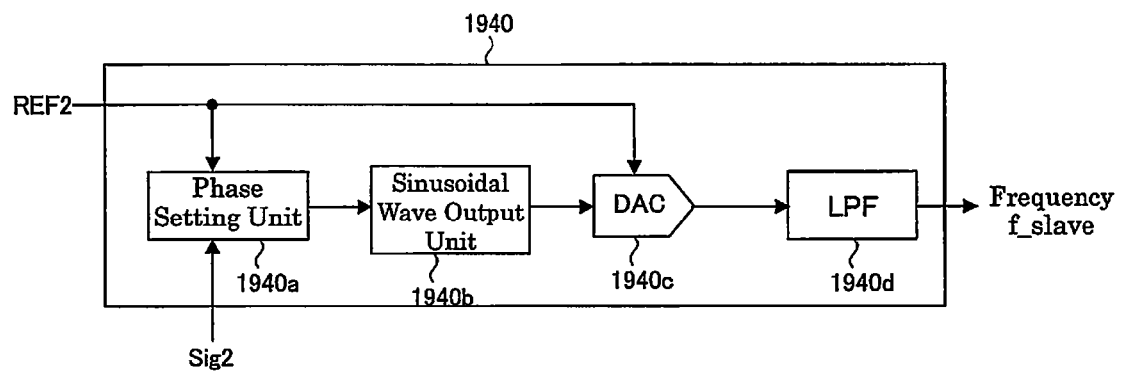
FIG. 5 is a diagram showing a configuration of the second DDS 1940 according to the first embodiment.

FIG. 5 is a diagram showing a configuration of the second DDS 1940 according to the first embodiment. The second DDS 1940 includes a phase setting unit 1940a, a sinusoidal wave output unit 1940b, a D/A converter (DAC) 1940c, and a low-pass filter (LPF) 1940d.

The sinusoidal wave output unit 1940b stores amplitudes of a sinusoidal wave for one period associated with phases represented in N bits (N is an integer equal to or more than 1). The phase takes a value from 0-360 degrees, and amplitudes of the sinusoidal wave at respective phases obtained by equally dividing 360 degrees by $2^N$ are stored. If a phase represented by N bits is input, the sinusoidal wave output unit 1940b outputs a signal having a magnitude corresponding to the amplitude of the sinusoidal wave at the phase.

The phase setting unit 1940a sets a phase based on the output frequency setting signal Sig2 upon reception of the internal signal REF2, and feeds the phase to the sinusoidal wave output unit 1940b.

The D/A converter (DAC) 1940c converts the digital signal output from the sinusoidal wave output unit 1940b into an analog signal, and outputs the converted analog signal. The internal signal REF2 is also fed as a clock signal to the D/A converter 1940c.

The low-pass filter (LPF) 1940d removes a high-frequency component of the output from the D/A converter 1940c. An output from the low-pass filter 1940d results in the output signal (frequency: f_slave) from the second DDS 1940.

The phase setting unit 1940a increments the phase by one bit (360 degrees is represented by N bits) each time when the phase setting unit 1940a receives the internal signal REF2, and feeds the phase to the sinusoidal wave output unit 1940b. As a result, the frequency of the signal output from the sinusoidal wave output unit 1940b is represented as $(1/2^N) \times$(frequency of internal signal REF2).

Similarly, if the phase setting unit 1940a increments the phase by X bits each time when the phase setting unit 1940a receives the internal signal REF2, and feeds the phase to the sinusoidal wave output unit 1940b, the frequency of the signal output from the sinusoidal wave output unit 1940b is represented as $(X/2^N) \times$(frequency of internal signal REF2). The incrementing the phase set by the phase setting unit 1940a by X bits can be realized by a latch and an adder. The circuit configuration is the same as a well-known DDS, and hence a description thereof is omitted.

It is appreciated that the frequency f_slave can be changed according to the value of X. On this occasion, a value of X which causes the frequency f_slave to be a desired value (such as 50 MHz-5 Hz or 50 MHz-10 Hz) is fed as the output frequency setting signal Sig2 to the phase setting unit 1940a.

A description will now be given of an operation of the first embodiment.

First, referring to FIG. 1, the motor driver control unit 29b feeds the signal SigM to the motor driver 18. As a result, the motor driver 18 translates the translation stage 112 for the master laser 11 in the X direction, thereby roughly making the repetition frequency of the first laser light pulse output from the master laser 11 coincident with the frequency f_master.

It should be noted that the control for the repetition frequency by the translation stage 112 is not precise. The control for the repetition frequency by the piezo element 111 is necessary for precisely controlling the repetition frequency.

Moreover, the motor driver control unit 29b feeds the signal SigS to the motor driver 28. As a result, the motor driver 28 translates the translation stage 212 for the slave laser 21 in the X direction, thereby roughly making the repetition frequency of the second laser light pulse output from the slave laser 21 coincident with the frequency f_slave.

It should be noted that the control for the repetition frequency by the translation stage 212 is not precise. The control for the repetition frequency by the piezo element 211 is necessary for precisely controlling the repetition frequency.

Moreover, the frequency synchronization signal source (signal source of multiple signals) 19 outputs the signal having the frequency f_master (first output) and the signal having the frequency f_slave (=f_master−Δ) (second output). The frequency of the first output and the frequency of the second output are extremely precise. In other words, the stability of the frequency of the first output and the stability of the frequency of the second output are extremely high.

Referring to FIG. 2, the signal having the predetermined frequency (f_master) is output as the first output from the first crystal oscillator 191, which is a high-precision crystal oscillator such as an oven-controlled crystal oscillator (OCXO). The frequency of the first output is thus extremely precise.

The signal having the predetermined frequency (f_master) is fed as the signal REF1 to the frequency converter 192. Moreover, the internal frequency setting signal Sig1 and the output frequency setting signal Sig2 are fed to the frequency converter 192. As a result, the signal (frequency: f_slave) as stable in frequency as the signal REF1 is output from the frequency converter 192.

Referring to FIG. 3, the first DDS 1920 receives the signal REF1 as the clock signal, and outputs the internal signal REF2 having the frequency based on the internal frequency setting signal Sig1. The second DDS 1940 receives the internal signal REF2 as the clock signal, and outputs the output signal having the frequency f_slave based on the output frequency setting signal Sig2.

It is assumed that a clock signal at 50 MHz is fed to a well-known direct digital synthesizer (DDS) to output a signal at 50 MHz-5 Hz or 50 MHz-10 Hz. If the direct digital synthesizer is caused to output a signal close in frequency to the clock signal, many spurious components are mixed with an output.

However, the inventor has founded that spurious components mixed with the output from the second DDS 1940 can be reduced by serially connecting the first DDS 1920 and the second DDS 1940, and largely displacing the frequency of the internal signal REF2 from f_master (displacing 3 MHz (=50 MHz−47 MHz), which is more than 10 kHz, for example). If the difference between f_master and the frequency of the internal signal REF2 is P[MHz], and f_master is Q[MHz], P and Q are preferably coprime (it is assumed that P is not 1). Though there may be provided a setting that P=3 and Q=50 as described above, there may be provided a setting that P=7 or 9, and Q=50, for example. Moreover, Q is not limited to 50, and may be 100, 25, or 10, for example.

Referring to FIG. 2, the phase comparator 193, the second crystal oscillator 194, and the loop filter 195 construct a PLL circuit. The phase comparator 193 compares, in phase, the output (frequency: f_slave) from the frequency converter 192 and the output from the second crystal oscillator 194 (which is a high-precision crystal oscillator such as an oven-controlled crystal oscillator (OCXO)), and detects and outputs the phase difference therebetween. The loop filter 195 removes the high-frequency component of the output from the phase comparator 193. The second crystal oscillator 194 receives the output (Vcont) from the loop filter 195, and changes the oscillation frequency according to Vcont so that the phase difference output from the phase comparator 193 is a constant value (such as 0, 90, and −90 degrees). As a result, the frequency of the signal output from the second crystal oscillator 194 is precisely set to f_slave.

The signal having the frequency f_slave is output as the second output from the second crystal oscillator 194. The frequency of the second output is thus extremely precise.

Referring to FIG. 1, the part of the first laser light pulse output from the master laser 11 is led by the optical coupler 12 to the photodiode 13, and undergoes the optical/electrical conversion. The master-side phase comparator 14 compares, in phase, the output from the photodiode 13 and the signal having the frequency f_master (first output) output from the frequency synchronization signal source 19 with each other, and detects and outputs the phase difference therebetween. The high frequency component is removed from the output from the master-side phase comparator 14 by the master-side loop filter 15, and the resulting output is amplified by the piezo driver 17, and is fed to the piezo element 111. The piezo element 111 contracts/extends so that the phase difference detected by the master-side phase comparator 14 has a constant value (0 degree, 90 degrees, or −90 degrees, for example). As a result, it is possible to precisely make the repetition frequency of the first laser light pulse coincident with the frequency f_master of the first output from the frequency synchronization signal source 19.

The part of the second laser light pulse output from the slave laser 21 is led by the optical coupler 22 to the photodiode 23, and undergoes the optical/electrical conversion. The slave-side phase comparator 24 compares, in phase, the output from the photodiode 23 and the signal having the frequency f_slave (second output) output from the frequency synchronization signal source 19 with each other, and detects and outputs the phase difference therebetween. The high frequency component is removed from the output from the slave-side phase comparator 24 by the slave-side loop filter 25, and the resulting output is amplified by the piezo driver 27, and is fed to the piezo element 211. The piezo element 211 contracts/extends so that the phase difference detected by the slave-side phase comparator 24 has a constant value (0 degree, 90 degrees, or −90 degrees, for example). As a result, it is possible to precisely make the repetition frequency of the second laser light pulse coincident with the frequency f_slave of the second output from the frequency synchronization signal source 19.

According to the first embodiment, the first output having the extremely precise frequency (f_master) is provided from the first crystal oscillator 191, which is a high precision crystal oscillator such as an oven-controlled crystal oscillator (OCXO), for example.

Moreover, the signal having the frequency f_slave containing reduced spurious components is provided from the second DDS 1940 of the frequency converter 192. The second output having the extremely precise frequency (f_slave) is provided from the second crystal oscillator 194, which is a high precision crystal oscillator such as an oven-controlled crystal oscillator (OCXO), for example, based on the signal from the second DDS 1940 of the frequency converter 192.

Further, the piezo elements 111, 211 extend/contract in the X direction based on the first output and the second output extremely precise in frequency, thereby precisely making the repetition frequency of the first laser light pulse and the repetition frequency of the second laser light pulse coincident with the frequency f_master and the frequency f_slave respectively, resulting in a reduced jitter as well.

In other words, it is possible to differentiate the repetition frequencies of the optical pulses (first laser light pulse and second laser light pulse) output from the two lasers (master laser 11 and the slave laser 21) by the desired quantity Δ (5 Hz or 10 Hz, for example), and also to restrain the jitter of the optical pulses (first laser light pulse and second laser light pulse).

Second Embodiment

The output device of multiple laser light pulses 1 according to a second embodiment is different from the output device of multiple laser light pulses 1 according to the first embodiment in that a variable phase shifter 30 is provided, and that the frequency f_master of the first output and the frequency f_slave of the second output from the frequency synchronization signal source 19 are equal.

Figure 6:
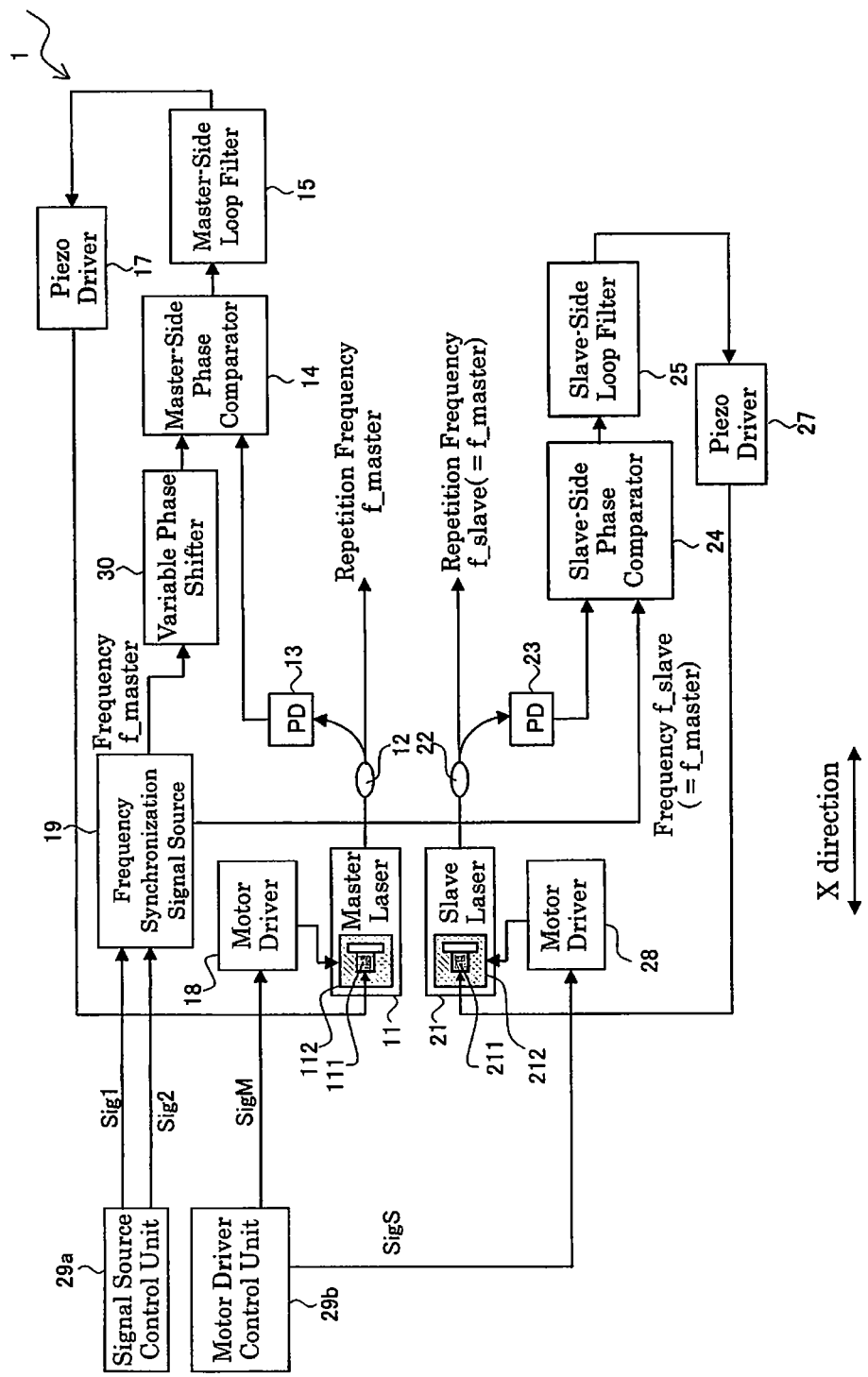
FIG. 6 is a diagram showing a configuration of the output device of multiple laser light pulses 1 according to the second embodiment.

FIG. 6 is a diagram showing a configuration of the output device of multiple laser light pulses 1 according to the second embodiment. In the following section, the same components are denoted by the same numerals as of the first embodiment, and will be explained in no more details.

The output device of multiple laser light pulses 1 according to the second embodiment includes the master laser (first laser) 11, the optical coupler 12, the photo diode 13, the master-side phase comparator (phase difference detector for first laser) 14, the master-side loop filter (loop filter for first laser) 15, the piezo driver 17, the motor driver 18, the frequency synchronization signal source (signal source of multiple signals) 19, the slave laser (second laser) 21, the optical coupler 22, the photo diode 23, the slave-side phase comparator (phase difference detector for second laser) 24, the slave-side loop filter (loop filter for second laser) 25, the piezo driver 27, the motor driver 28, the signal source control unit 29a, the motor driver control unit 29b, and the variable phase shifter 30.

The frequency f_master of the first output and the frequency f_slave of the second output from the frequency synchronization signal source (signal source of multiple signals) 19 are equal. The variable phase shifter 30 receives the first output from the frequency synchronization signal source 19, changes the phase of the first output, and outputs the resulting first output to the master-side phase comparator 14. The change in phase by the variable phase shifter 30 is variable.

The other elements and parts are the same as those of the first embodiment, and a description thereof, therefore, is omitted.

An operation of the second embodiment is the same as that of the first embodiment. However, the repetition frequency of the first laser light pulse and the repetition frequency of the second laser light pulse are the same. Moreover, the phase difference between the first laser light pulse and the second laser light pulse corresponds to the change in phase by the variable phase shifter 30.

According to the second embodiment, the repetition frequency of the first laser light pulse output from the master laser 11 and the repetition frequency of the second laser light pulse output from the slave laser 21 can be the same, and the mutual phase difference can be arbitrarily controlled.

Figure 7:
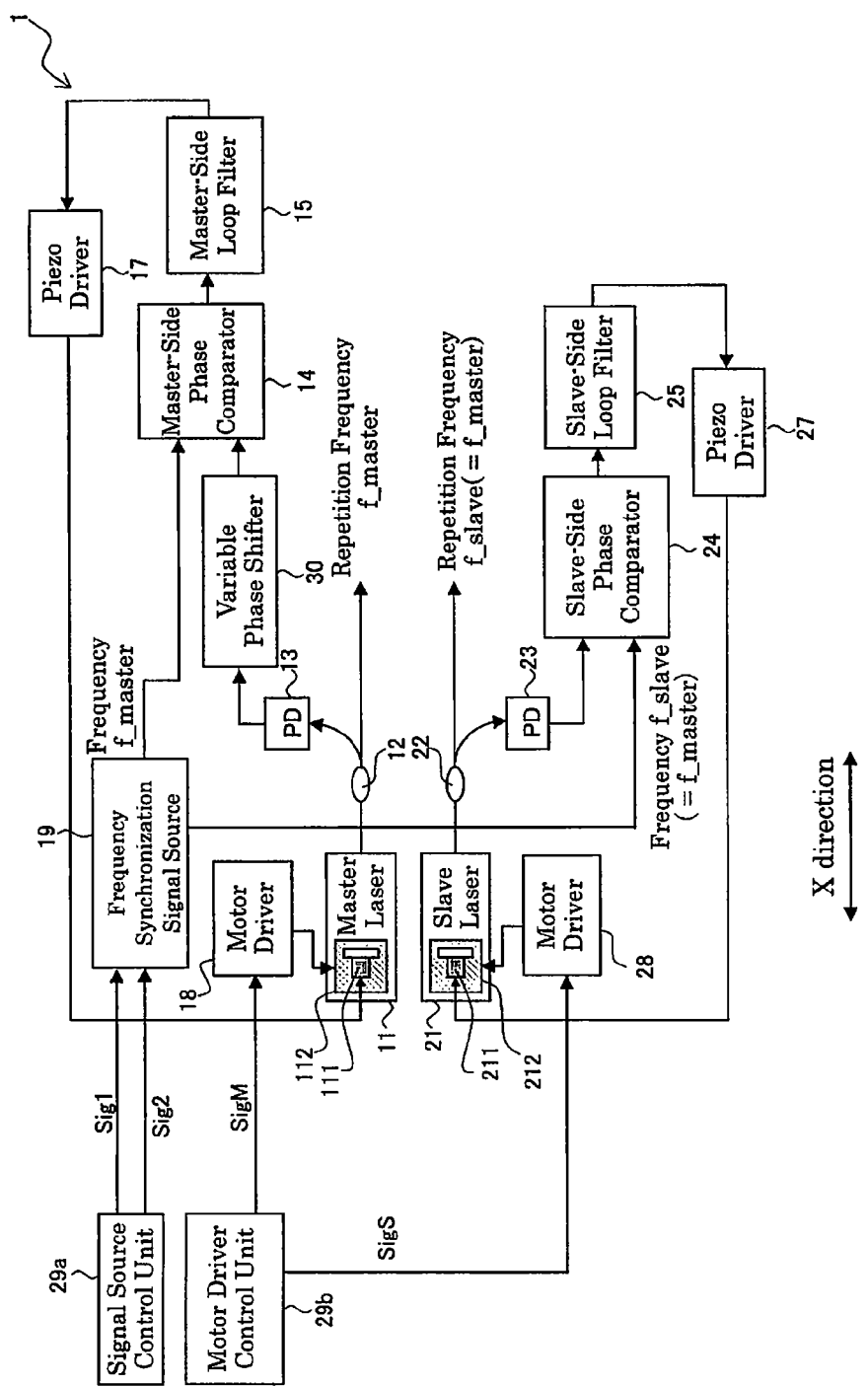
FIG. 7 is a diagram showing a configuration of the output device of multiple laser light pulses 1 according to a first variation of the second embodiment.
Figure 8:
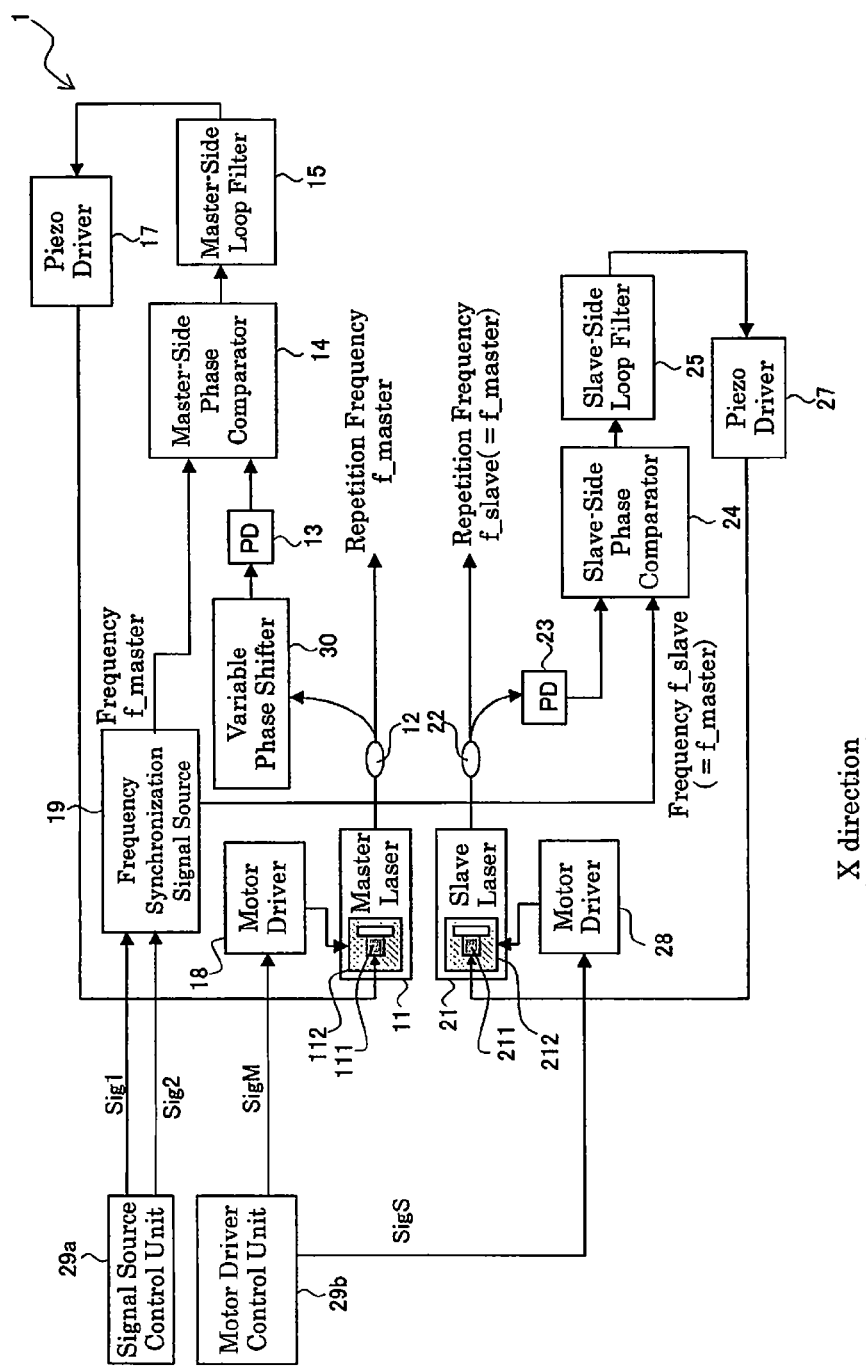
FIG. 8 is a diagram showing a configuration of the output device of multiple laser light pulses 1 according to a second variation of the second embodiment.

Though the phase of the first output is changed by the variable phase shifter 30 according to the second embodiment, the phase of the electric signal converted from the output from the first laser 11 (first laser light pulse) may be changed (refer to FIG. 7), or the phase of the output from the first laser 11 (first laser light pulse) before the conversion to the electric signal may be changed (refer to FIG. 8).

FIG. 7 is a diagram showing a configuration of the output device of multiple laser light pulses 1 according to a first variation of the second embodiment. The variable phase shifter 30 receives the output from the photodiode 13, changes the phase of the output, and outputs the resulting output to the master-side phase comparator 14. It should be noted that the output from the photodiode 13 is the electric signal converted from the output (first laser light pulse) from the first laser 11. The first variation is the same as the second embodiment except for the variable phase shifter 30, and a description thereof, therefore, is omitted.

FIG. 8 is a diagram showing a configuration of the output device of multiple laser light pulses 1 according to a second variation of the second embodiment. The variable phase shifter 30 receives the output from the optical coupler 12, changes the phase of the output, and outputs the resulting output to the photodiode 13. It should be noted that the output from the optical coupler 12 is the output (first laser light pulse) from the first laser 11 before the conversion to the electric signal by the photodiode 13. The second variation is the same as the second embodiment except for the variable phase shifter 30, and a description thereof, therefore, is omitted.

Third Embodiment

The output device of multiple laser light pulses 1 according to a third embodiment is different from the output device of multiple laser light pulses 1 according to the first embodiment in that the variable phase shifter 30 is provided, and that the frequency f_master of the first output and the frequency f_slave of the second output from the frequency synchronization signal source 19 are equal.

Figure 9:
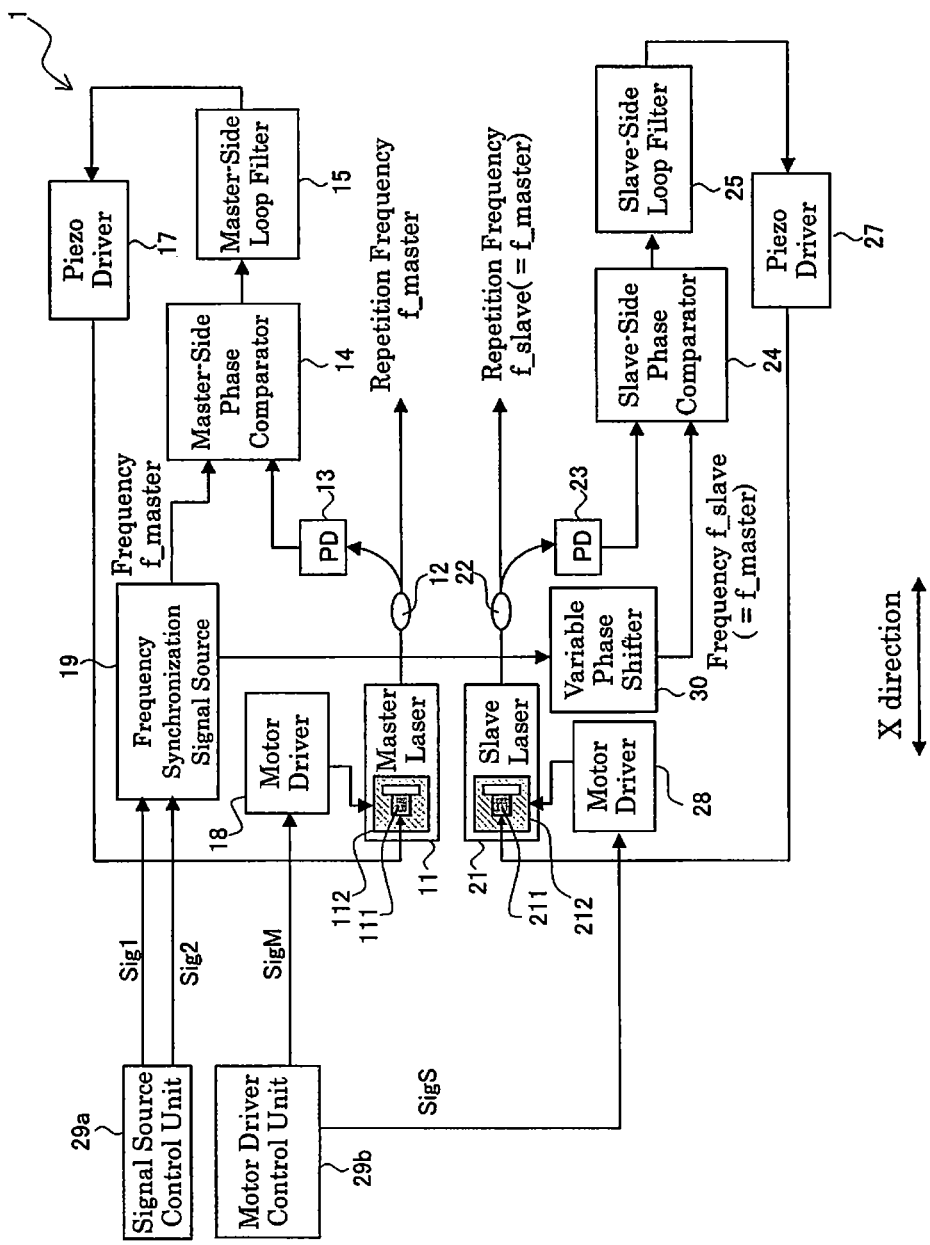
FIG. 9 is a diagram showing a configuration of the output device of multiple laser light pulses 1 according to the third embodiment.

FIG. 9 is a diagram showing a configuration of the output device of multiple laser light pulses 1 according to the third embodiment. In the following section, the same components are denoted by the same numerals as of the first embodiment, and will be explained in no more details.

The output device of multiple laser light pulses 1 according to the third embodiment includes the master laser (first laser) 11, the optical coupler 12, the photo diode 13, the master-side phase comparator (phase difference detector for first laser) 14, the master-side loop filter (loop filter for first laser) 15, the piezo driver 17, the motor driver 18, the frequency synchronization signal source (signal source of multiple signals) 19, the slave laser (second laser) 21, the optical coupler 22, the photo diode 23, the slave-side phase comparator (phase difference detector for second laser) 24, the slave-side loop filter (loop filter for second laser) 25, the piezo driver 27, the motor driver 28, the signal source control unit 29a, the motor driver control unit 29b, and the variable phase shifter 30.

The frequency f_master of the first output and the frequency f_slave of the second output from the frequency synchronization signal source (signal source of multiple signals) 19 are equal. The variable phase shifter 30 receives the second output from the frequency synchronization signal source 19, changes the phase of the second output, and outputs the resulting second output to the slave-side phase comparator 24. The change in phase by the variable phase shifter 30 is variable.

The other elements and parts are the same as those of the first embodiment, and a description thereof, therefore, is omitted.

An operation of the third embodiment is the same as that of the first embodiment. However, the repetition frequency of the first laser light pulse and the repetition frequency of the second laser light pulse are the same. Moreover, the phase difference between the first laser light pulse and the second laser light pulse corresponds to the change in phase by the variable phase shifter 30.

According to the third embodiment, the repetition frequency of the first laser light pulse output from the master laser 11 and the repetition frequency of the second laser light pulse output from the slave laser 21 can be the same, and the mutual phase difference can be arbitrarily controlled.

Figure 10:
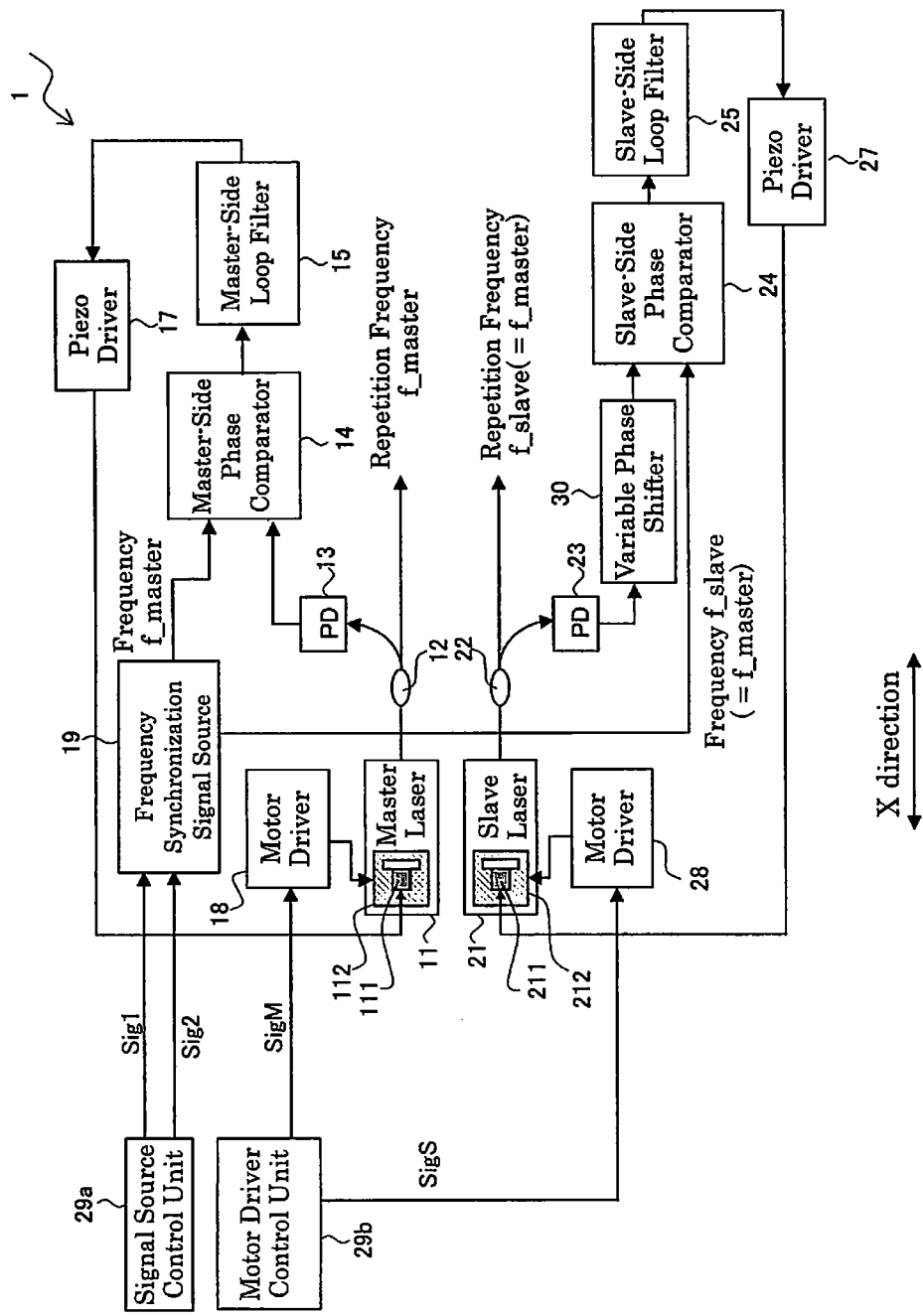
FIG. 10 is a diagram showing a configuration of the output device of multiple laser light pulses 1 according to a first variation of the third embodiment.
Figure 11:
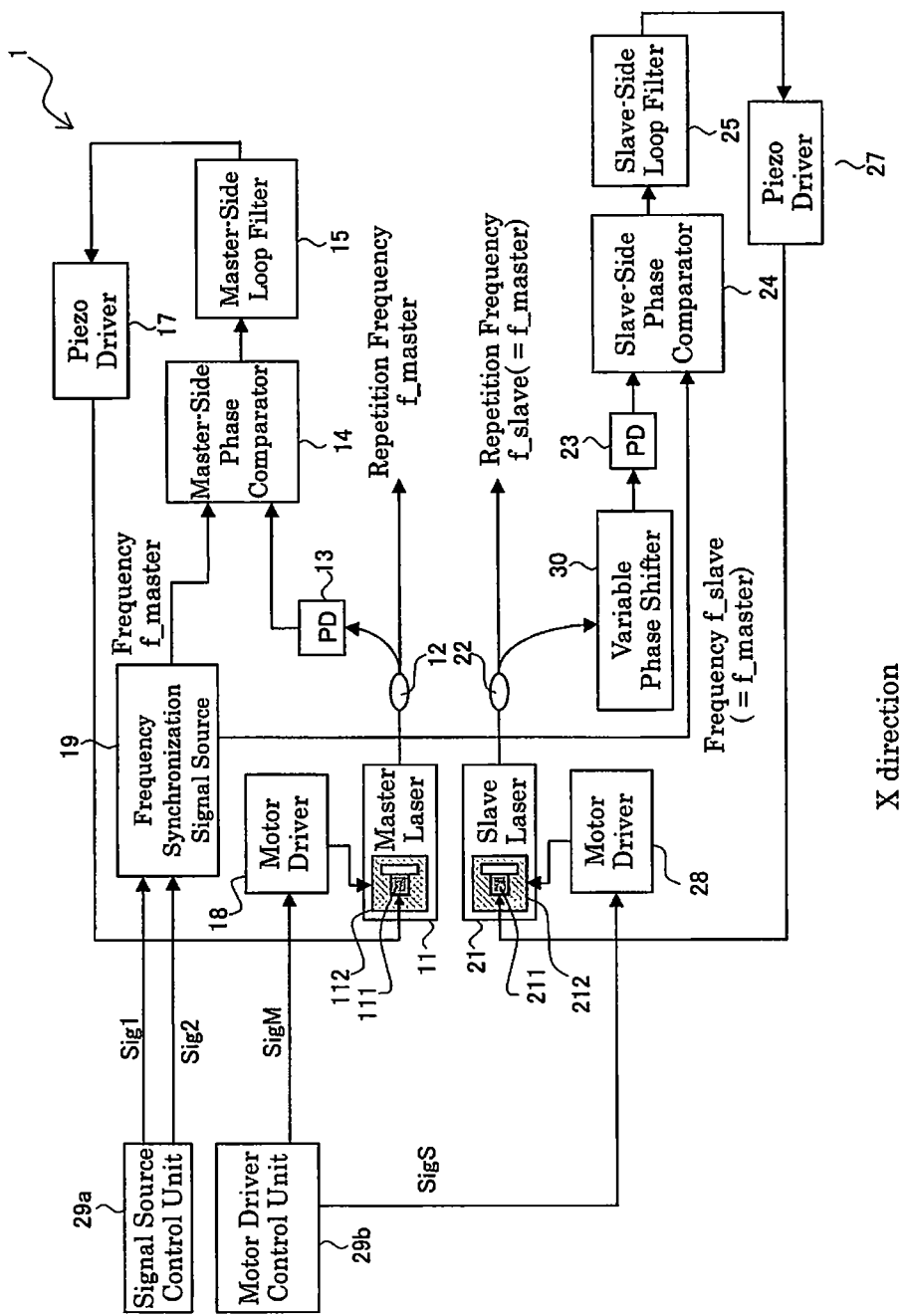
FIG. 11 is a diagram showing a configuration of the output device of multiple laser light pulses 1 according to a second variation of the third embodiment.

Though the phase of the second output is changed by the variable phase shifter 30 according to the third embodiment, the phase of the electric signal converted from the output from the second laser 21 (second laser light pulse) may be changed (refer to FIG. 10), or the phase of the output from the second laser 21 (second laser light pulse) before the conversion to the electric signal may be changed (refer to FIG. 11).

FIG. 10 is a diagram showing a configuration of the output device of multiple laser light pulses 1 according to a first variation of the third embodiment. The variable phase shifter 30 receives the output from the photodiode 23, changes the phase of the output, and outputs the resulting output to the slave-side phase comparator 24. It should be noted that the output from the photodiode 23 is the electric signal converted from the output (second laser light pulse) from the second laser 21. The first variation is the same as the third embodiment except for the variable phase shifter 30, and a description thereof, therefore, is omitted.

FIG. 11 is a diagram showing a configuration of the output device of multiple laser light pulses 1 according to a second variation of the third embodiment. The variable phase shifter 30 receives the output from the optical coupler 22, changes the phase of the output, and outputs the resulting output to the photodiode 23. It should be noted that the output from the optical coupler 22 is the output (second laser light pulse) from the second laser 21 before the conversion to the electric signal by the photodiode 23. The second variation is the same as the third embodiment except for the variable phase shifter 30, and a description thereof, therefore, is omitted.

Fourth Embodiment

The output device of multiple laser light pulses 1 according to a fourth embodiment is obtained by adding an analog signal adder 31 to the output device of multiple laser light pulses 1 according to the second embodiment (refer to FIG. 6).

Figure 12:
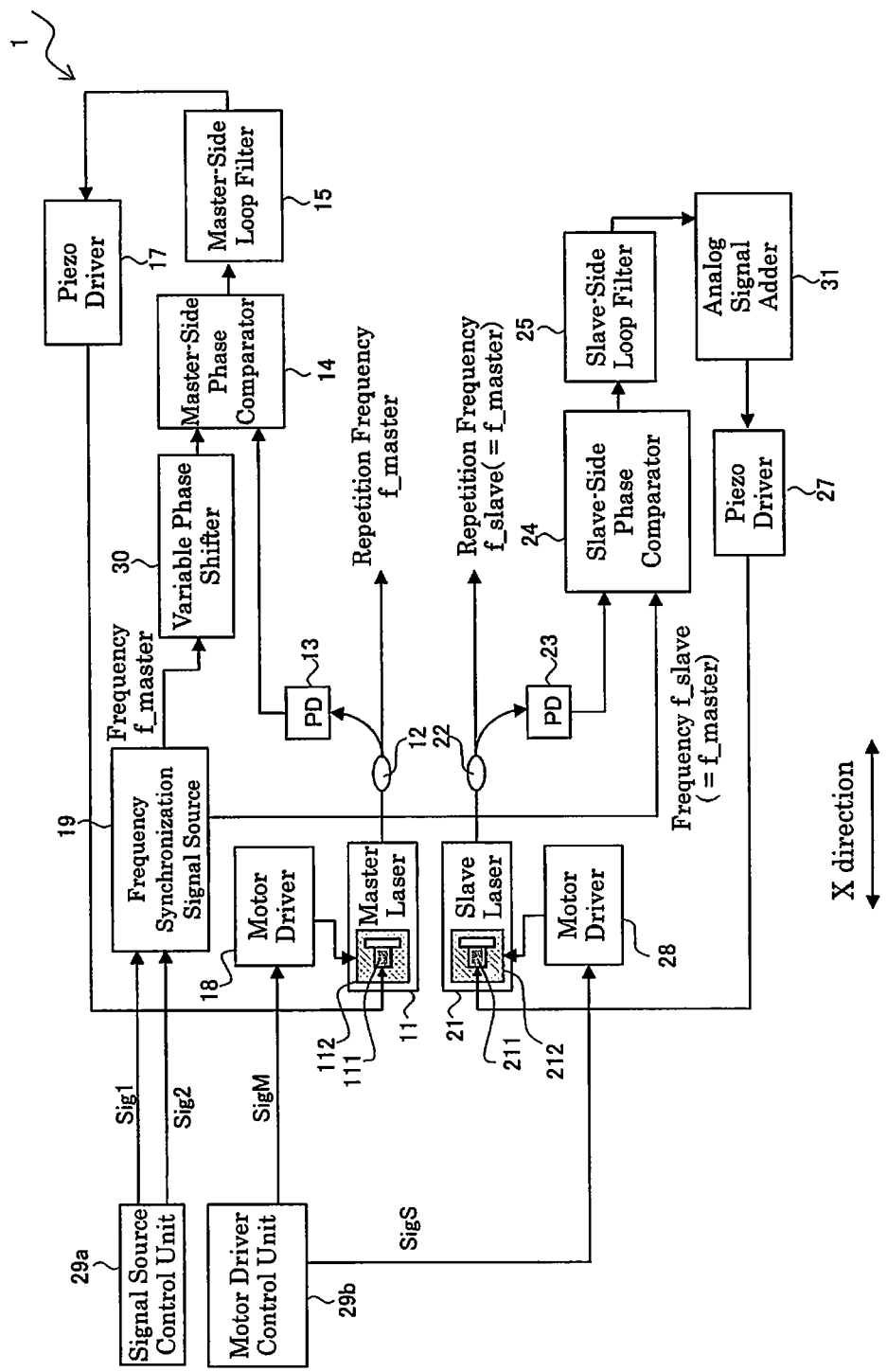
FIG. 12 is a diagram showing a configuration of the output device of multiple laser light pulses 1 according to the fourth embodiment.

FIG. 12 is a diagram showing a configuration of the output device of multiple laser light pulses 1 according to the fourth embodiment.

The output device of multiple laser light pulses 1 according to the fourth embodiment includes the master laser (first laser) 11, the optical coupler 12, the photo diode 13, the master-side phase comparator (phase difference detector for first laser) 14, the master-side loop filter (loop filter for first laser) 15, the piezo driver 17, the motor driver 18, the frequency synchronization signal source (signal source of multiple signals) 19, the slave laser (second laser) 21, the optical coupler 22, the photo diode 23, the slave-side phase comparator (phase difference detector for second laser) 24, the slave-side loop filter (loop filter for second laser) 25, the piezo driver 27, the motor driver 28, the signal source control unit 29a, the motor driver control unit 29b, the variable phase shifter 30, and the analog signal adder 31.

The analog signal adder 31 adds an analog signal to the output from the slave-side loop filter (loop filter for second laser) 25, and feeds a resulting signal to the piezo driver 27. The analog signal is any one of a square wave, a sinusoidal wave, a rectangular wave, and a signal having a waveform arbitrarily specified by a user of the output device of multiple laser light pulses 1. The other elements and parts are the same as those of the second embodiment, and a description thereof, therefore, is omitted.

An operation of the fourth embodiment is the same as that of the second embodiment.

According to the fourth embodiment, the phase of the output from the slaver laser 21 can be modulated.

The description has been given of the output device of multiple laser light pulses 1 according to the fourth embodiment as obtained by adding the analog signal adder 31 to the output device of multiple laser light pulses 1 according to the second embodiment (refer to FIG. 6). However, the analog signal adder 31 may be added to the first variation of the second embodiment (refer to FIG. 7), the second variation of the second embodiment (refer to FIG. 8), the third embodiment (refer to FIG. 9), the first variation of the third embodiment (refer to FIG. 10), and the second variation of the third embodiment (refer to FIG. 11).

Fifth Embodiment

The output device of multiple laser light pulses 1 according to a fifth embodiment is obtained by adding an analog signal adder 31 to the output device of multiple laser light pulses 1 according to the second embodiment (refer to FIG. 6).

Figure 13:
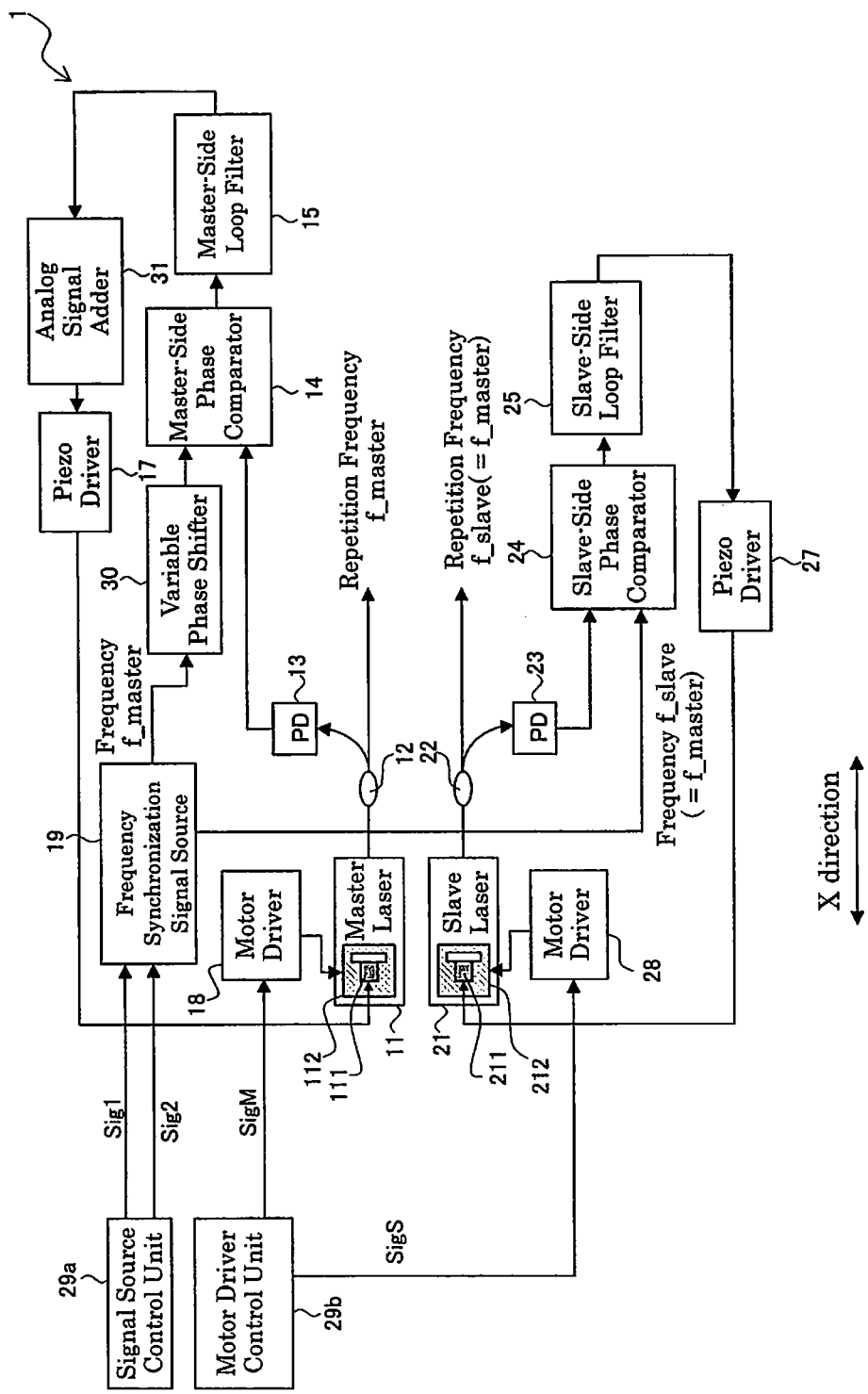
FIG. 13 is a diagram showing a configuration of the output device of multiple laser light pulses 1 according to the fifth embodiment.

FIG. 13 is a diagram showing a configuration of the output device of multiple laser light pulses 1 according to the fifth embodiment.

The output device of multiple laser light pulses 1 according to the fifth embodiment includes the master laser (first laser) 11, the optical coupler 12, the photo diode 13, the master-side phase comparator (phase difference detector for first laser) 14, the master-side loop filter (loop filter for first laser) 15, the piezo driver 17, the motor driver 18, the frequency synchronization signal source (signal source of multiple signals) 19, the slave laser (second laser) 21, the optical coupler 22, the photo diode 23, the slave-side phase comparator (phase difference detector for second laser) 24, the slave-side loop filter (loop filter for second laser) 25, the piezo driver 27, the motor driver 28, the signal source control unit 29a, the motor driver control unit 29b, the variable phase shifter 30, and the analog signal adder 31.

The analog signal adder 31 adds an analog signal to the output from the master-side loop filter (loop filter for first laser) 15, and feeds a resulting signal to the piezo driver 17. The analog signal is any one of a square wave, a sinusoidal wave, a rectangular wave, and a signal having a waveform arbitrarily specified by a user of the output device of multiple laser light pulses 1. The other elements and parts are the same as those of the second embodiment, and a description thereof, therefore, is omitted.

An operation of the fifth embodiment is the same as that of the second embodiment.

According to the fifth embodiment, the phase of the output from the maser laser 11 can be modulated.

The description has been given of the output device of multiple laser light pulses 1 according to the fifth embodiment as obtained by adding the analog signal adder 31 to the output device of multiple laser light pulses 1 according to the second embodiment (refer to FIG. 6). However, the analog signal adder 31 may be added to the first variation of the second embodiment (refer to FIG. 7), the second variation of the second embodiment (refer to FIG. 8), the third embodiment (refer to FIG. 9), the first variation of the third embodiment (refer to FIG. 10), and the second variation of the third embodiment (refer to FIG. 11).

Sixth Embodiment

The output device of multiple laser light pulses 1 according to a sixth embodiment is different from the output device of multiple laser light pulses 1 according to the first embodiment in that a signal (third output) having a frequency f_slave' (=f_master+Δ) in addition to the signal (first output) having the frequency f_master and the signal (second output) having the frequency f_slave (=f_master−Δ) are output from the frequency synchronization signal source 19, and that a switch 32 which feeds the second output or the third output to the slave-side phase comparator 24 is provided.

Figure 14:
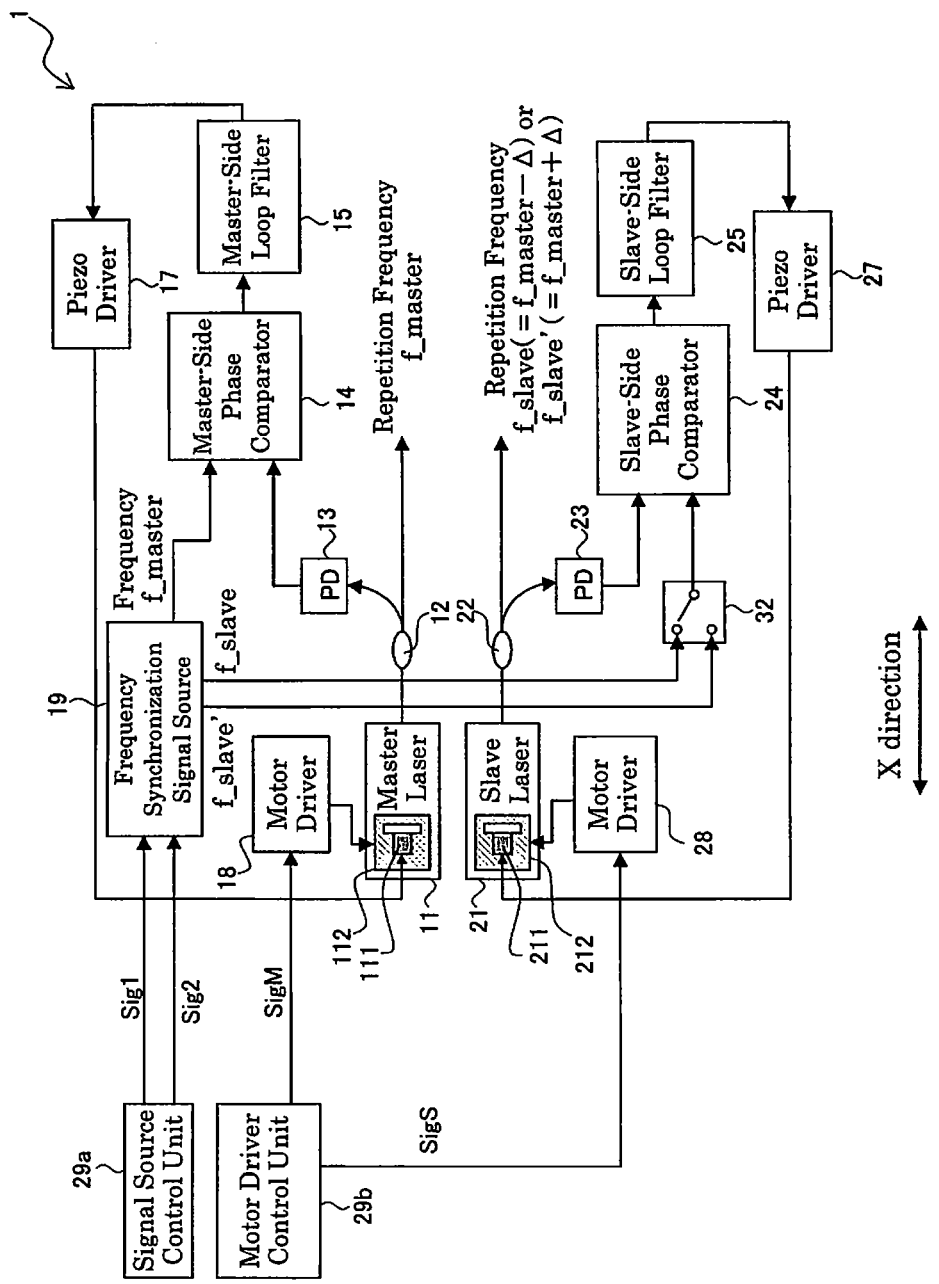
FIG. 14 is a diagram showing a configuration of the output device of multiple laser light pulses 1 according to the sixth embodiment.

FIG. 14 is a diagram showing a configuration of the output device of multiple laser light pulses 1 according to the sixth embodiment.

The output device of multiple laser light pulses 1 according to the sixth embodiment includes the master laser (first laser) 11, the optical coupler 12, the photo diode 13, the master-side phase comparator (phase difference detector for first laser) 14, the master-side loop filter (loop filter for first laser) 15, the piezo driver 17, the motor driver 18, the frequency synchronization signal source (signal source of multiple signals) 19, the slave laser (second laser) 21, the optical coupler 22, the photo diode 23, the slave-side phase comparator (phase difference detector for second laser) 24, the slave-side loop filter (loop filter for second laser) 25, the piezo driver 27, the motor driver 28, the signal source control unit 29a, the motor driver control unit 29b, and the switch 32.

The frequency synchronization signal source 19 outputs the signal having the frequency f_master (first output) and the signal having the frequency f_slave (=f_master−Δ) (second output) as in the first embodiment. The frequency synchronization signal source 19 further outputs the signal (third output) having the frequency f_slave' (=f_master+Δ). The values of f_master and Δ are the same as those of the first embodiment.

Figure 15:
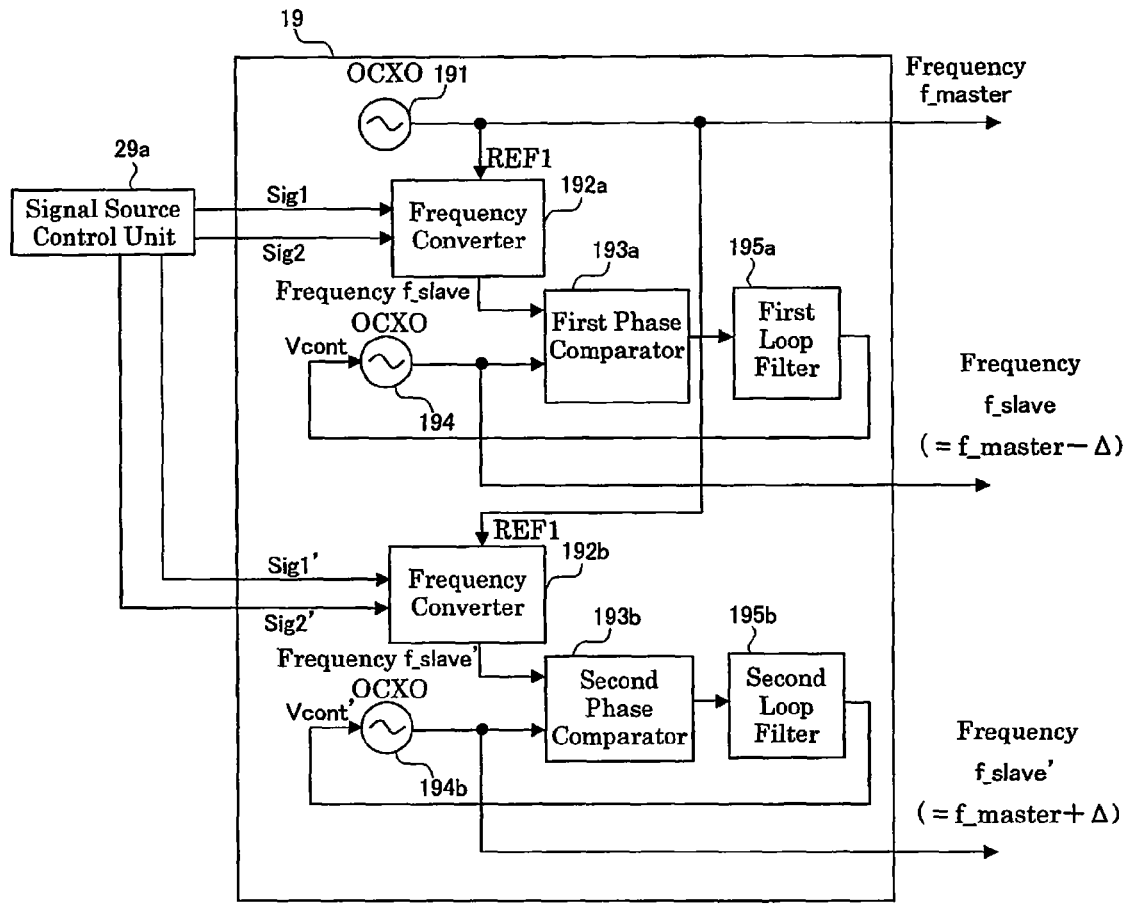
FIG. 15 is a diagram showing a configuration of the frequency synchronization signal source 19 according to the sixth embodiment.

FIG. 15 is a diagram showing a configuration of the frequency synchronization signal source 19 according to the sixth embodiment. The frequency synchronization signal source 19 according to the sixth embodiment includes the first crystal oscillator 191, frequency converters (signal output devices) 192a, 192b, a first phase comparator (first phase difference detector) 193a, a second phase comparator (second phase difference detector) 193b, the second crystal oscillator 194, a third crystal oscillator 194b, a first loop filter 195a, and a second loop filter 195b.

The first crystal oscillator 191 is the same as that of the first embodiment, and hence a description thereof is omitted.

The frequency converter (signal output device) 192a, the first phase comparator (first phase difference detector) 193a, the second crystal oscillator 194, and the first loop filter 195a are respectively the same as the frequency converter (signal output device) 192, the phase comparator (phase difference detector) 193, the second crystal oscillator 194, and the loop filter 195.

For example, the first phase comparator 193a detects and outputs a phase difference between an output from the frequency converter 192a and an output from the second crystal oscillator 194. The first loop filter 195a removes a high-frequency component of the output from the first phase comparator 193a. The second crystal oscillator 194 receives the output (Vcont) from the first loop filter 195a, and changes the oscillation frequency according to Vcont. It should be noted that the second crystal oscillator 194 changes the oscillation frequency so that the phase difference output from the first phase comparator 193a has a constant value (0 degree, 90 degrees, or −90 degrees, for example).

The frequency converter (signal output device) 192b, the second phase comparator (second phase difference detector) 193b, the third crystal oscillator 194b, and the second loop filter 195b are respectively the same as the frequency converter (signal output device) 192, the phase comparator (phase difference detector) 193, the second crystal oscillator 194, and the loop filter 195 according to the first embodiment (refer to FIG. 2).

For example, the second phase comparator 193b detects and outputs a phase difference between an output from the frequency converter 192b and an output from the third crystal oscillator 194b. The second loop filter 195b removes a high-frequency component of the output from the second phase comparator 193b. The third crystal oscillator 194b receives an output (Vcont') from the second loop filter 195b, and changes the oscillation frequency according to Vcont'. It should be noted that the third crystal oscillator 194b changes the oscillation frequency so that the phase difference output from the second phase comparator 193b has a constant value (0 degree, 90 degrees, or −90 degrees, for example).

On this occasion, the output from the first crystal oscillator 191 is designated as first output (signal having the frequency f_master). The output from the second crystal oscillator 194 is designated as second output (signal having the frequency f_slave). The output from the third crystal oscillator 194b is designated as third output (signal having the frequency f_slave').

At least one of the first crystal oscillator 191, the second crystal oscillator 194, and the third crystal oscillator 194b is preferably an oven-controlled crystal oscillator (OCXOs).

The internal frequency setting signal Sig1 and the output frequency setting signal Sig2 are fed from the signal source control unit 29a to the frequency converter 192a. An internal frequency setting signal Sig1' and an output frequency setting signal Sig2' are fed from the signal source control unit 29a to the frequency converter 192b. As a result, the signal having the frequency f_slave is output from the frequency converter 192a, and the signal having the frequency f_slave' is output from the frequency converter 192b.

Referring to FIG. 14, the switch 32 receives the second output (signal having the frequency f_slave) and the third output (signal having the frequency f_slave'), outputs the second output or the third output, and feeds the output signal to the slave-side phase comparator 24. The switch 32 is a SPDT (Single Pole Double Throw) switch, for example, includes a terminal which receives the second output, a terminal which receives the third output, and a terminal connected to an input to the slave-side phase comparator 24, and connects either one of the terminal which receives the second output and the terminal which receives the third output to the terminal connected to the input of the slave-side phase comparator 24.

The slave-side phase comparator 24 compares, in phase, the output from the photo diode 23 and the output from the switch 32, detects the phase difference therebetween, and outputs the phase difference.

Elements and parts other than the frequency synchronization signal source 19, the slave-side phase comparator 24, the signal source control unit 29a, and the switch 32 are the same as those of the first embodiment, and hence a description thereof is omitted.

An operation of the sixth embodiment is approximately the same as that of the first embodiment. However, if the switch 32 feeds the second output to the slave-side phase comparator 24, the slave laser 21 outputs the second laser light pulse having the repetition frequency f_slave. If the switch 32 feeds the third output to the slave-side phase comparator 24, the slave laser 21 outputs the second laser light pulse having the repetition frequency f_slave'. The switch 32 alternately feeds the second output and third output to the slave-side phase comparator 24 such that the switch 32 first feeds the second output to the slave-side phase comparator 24, after a while, feeds the third output to the slave-side phase comparator 24, and, after a while, feeds the second output to the slave-side phase comparator 24.

The phase of the second laser light pulse output from the slave laser 21 with respect to the phase of the first laser light pulse output from the master laser 11 monotonically increases according to the first embodiment.

On this occasion, the switch 32 alternately feeds the second output and the third output to the slave-side phase comparator 24 according to the sixth embodiment. As a result, it is possible to switch the phase of the second laser light pulse output from the slave laser 21 with respect to the phase of the first laser light pulse output from the master laser 11 from the monotonic increase to the monotonic decrease, or from the monotonic decrease to the monotonic increase.

The invention claimed is:

1. A signal output device comprising:
    a first direct digital synthesizer that receives a signal having a predetermined frequency as a clock signal and further an internal frequency setting signal, and outputs an internal signal having a frequency based on the internal frequency setting signal; and
    a second direct digital synthesizer that directly receives the internal signal as a clock signal, and further an output frequency setting signal, and outputs an output signal having a frequency based on the output frequency setting signal,
    wherein a difference between the predetermined frequency and the frequency of the internal signal is larger than a difference between the predetermined frequency and the frequency of the output signal.

2. The signal output device according to claim 1, wherein the difference between the predetermined frequency and the frequency of the internal signal is larger than 10kHz.

3. The signal output device according to claim 1, wherein if the difference between the predetermined frequency and the frequency of the internal signal is represented as P[MHz], and the predetermined frequency is represented as Q[MH$_z$], P and Q are coprime, and P is not 1.

4. The signal output device according to claim 1, wherein the first direct digital synthesizer:
    sets a phase based on the internal frequency setting signal upon reception of the signal having the predetermined frequency; and
    outputs a signal having an amplitude corresponding to an amplitude of a sine wave at the phase.

5. The signal output device according to claim 1, wherein the second direct digital synthesizer:
    sets a phase based on the output frequency setting signal upon reception of the internal signal; and
    outputs a signal having an amplitude corresponding to an amplitude of a sine wave at the phase.

6. The signal output device according to claim 1, wherein the signal having the predetermined frequency is a signal output from an oven-controlled crystal oscillator.

7. A signal source of a plurality of signals comprising:
    the signal output device according to claim 1;
    a first crystal oscillator that outputs a signal having the predetermined frequency;
    a second crystal oscillator;
    a phase difference detector that detects a phase difference between an output from the signal output device and an output from the second crystal oscillator; and
    a loop filter that removes a high frequency component of an output from the phase difference detector, wherein:
    the second crystal oscillator changes an oscillation frequency according to an output from the loop filter;
    the output from the first crystal oscillator is a first output; and
    the output from the second crystal oscillator is a second output.

8. The signal source of a plurality of signals according to claim 7, wherein at least one of the first crystal oscillator and the second crystal oscillator is an oven-controlled crystal oscillator.

9. A signal source of a plurality of signals comprising:
two of the signal output devices according to claim 1;
a first crystal oscillator that outputs a signal having the predetermined frequency;
a second crystal oscillator;
a third crystal oscillator;
a first phase difference detector that detects a phase difference between an output from one of the signal output devices and an output from the second crystal oscillator;
a first loop filter that removes a high frequency component of an output from the first phase difference detector;
a second phase difference detector that detects a phase difference between an output from the other of the signal output device and an output from the third crystal oscillator; and
a second loop filter that removes a high frequency component of an output from the second phase difference detector, wherein:
the second crystal oscillator changes an oscillation frequency according to an output from the first loop filter;
the third crystal oscillator changes an oscillation frequency according to an output from the second loop filter;
the output from the first crystal oscillator is a first output;
the output from the second crystal oscillator is a second output; and
the output from the third crystal oscillator is a third output.

10. The signal source of a plurality of signals according to claim 9, wherein at least one of the first crystal oscillator, the second crystal oscillator, and the third crystal oscillator is an oven-controlled crystal oscillator.

11. An output device of a plurality of laser light pulses comprising:
the signal source of a plurality of signals according to claim 7;
a first laser that outputs a first laser light pulse;
a phase difference detector for first laser that detects a phase difference between an electric signal obtained by converting the first laser light pulse and the first output;
a loop filter for first laser that removes a high frequency component of an output from the phase difference detector for first laser;
a second laser that outputs a second laser light pulse;
a phase difference detector for second laser that detects a phase difference between an electric signal obtained by converting the second laser light pulse and the second output; and
a loop filter for second laser that removes a high frequency component of an output from the phase difference detector for the second laser, wherein:
the first laser changes a repetition frequency of the first laser light pulse according to an output from the loop filter for first laser; and
the second laser changes a repetition frequency of the second laser light pulse according to an output from the loop filter for second laser.

12. The output device of a plurality of laser light pulses according to claim 11, comprising a phase shifter that receives any one of the output from the first laser before the conversion into the electric signal, the electric signal obtained by converting the output from the first laser, and the first output, changes the phase thereof, and outputs a result of the change in phase, wherein the frequency of the first output and the frequency of the second output are equal to each other.

13. The output device of a plurality of laser light pulses according to claim 11, comprising a phase shifter that receives any one of the output from the second laser before the conversion into the electric signal, the electric signal obtained by converting the output from the second laser, and the second output, changes the phase thereof, and outputs a result of the change in phase, wherein the frequency of the first output and the frequency of the second output are equal to each other.

14. The output device of a plurality of laser light pulses according to claim 12, comprising an analog signal adder that adds an analog signal to either one of the output from the loop filter for first laser and the output from the loop filter for second laser.

15. The output device of a plurality of laser light pulses according to claim 14, wherein the analog signal is any one of a square wave, a sinusoidal wave, a rectangular wave, and a signal having a waveform arbitrarily specified by a user of the output device of a plurality of laser light pulses.

16. An output device of a plurality of laser light pulses comprising:
the signal source of a plurality of signals according to claim 9;
a first laser that outputs a first laser light pulse;
a phase difference detector for first laser that detects a phase difference between an electric signal obtained by converting the first laser light pulse and the first output;
a loop filter for first laser that removes a high frequency component of an output from the phase difference detector for the first laser;
a switch that receives the second output and the third output and outputs either one of the second output and the third output;
a second laser that outputs a second laser light pulse;
a phase difference detector for second laser that detects a phase difference between an electric signal obtained by converting the second laser light pulse and the output from the switch; and
a loop filter for second laser that removes a high frequency component of an output from the phase difference detector for the second laser, wherein:
the first laser changes a repetition frequency of the first laser light pulse according to an output from the loop filter for first laser; and
the second laser changes a repetition frequency of the second laser light pulse according to an output from the loop filter for second laser.

* * * * *